(12) United States Patent
Hsu et al.

(10) Patent No.: US 11,222,880 B2
(45) Date of Patent: Jan. 11, 2022

(54) PACKAGE STRUCTURE FOR SEMICONDUCTOR DEVICE AND MANUFACTURING METHOD THEREOF

(71) Applicant: Phoenix & Corporation, Grand Cayman (KY)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/537,694

(22) Filed: Aug. 12, 2019

(65) Prior Publication Data
US 2020/0075565 A1    Mar. 5, 2020

(30) Foreign Application Priority Data

Aug. 29, 2018   (TW) ................................ 107130072

(51) Int. Cl.
*H01L 25/16*       (2006.01)
*H01L 23/31*       (2006.01)
(Continued)

(52) U.S. Cl.
CPC ........ *H01L 25/167* (2013.01); *H01L 21/4853* (2013.01); *H01L 21/4857* (2013.01);
(Continued)

(58) Field of Classification Search
CPC ............... H01L 25/167; H01L 23/3128; H01L 23/5383; H01L 23/5386; H01L 23/5389; H01L 24/73; H01L 24/20; H01L 24/19; H01L 21/6835; H01L 21/4857; H01L 21/4853; H01L 21/568; H01L 21/561; H01L 21/565; H01L 21/78; H01L 25/165; H01L 2221/68372; H01L 2224/73277; H01L 2224/214; H01L 2221/68354; H01L 2221/68345; H01L 2224/92247; H01L 2224/73265; H01L 2224/12105; H01L 2224/97; H01L 2224/04105; H01L 2224/32245; H01L 2224/73267; H01L 2224/92244

(Continued)

(56) References Cited

U.S. PATENT DOCUMENTS 7,858,441 B2 *  12/2010  Lin ..................... H01L 25/0652
                                                 438/109
2019/0385989 A1 * 12/2019 Yu ....................... H01L 23/5383

* cited by examiner

*Primary Examiner* — Vu A Vu
(74) *Attorney, Agent, or Firm* — McClure, Qualey & Rodack, LLP

(57) ABSTRACT

A package structure for a semiconductor device includes a first conductive layer, a second conductive layer, a first die, a second die, a plurality of first blind via pillars and a conductive structure. The first conductive layer has a first surface and a second surface. The first die and the second die respectively have an active surface and a back surface, which are disposed opposite to each other. There is a plurality of metal pads disposed on the active surface. The first die is attached to the first surface of the first conductive layer with its back surface, and the second die is attached to the second surface of the first conductive layer with its back surface. The first and second conductive layers, the first and second dies, the first blind hole pillars and conductive structure are covered by a dielectric material.

16 Claims, 15 Drawing Sheets

(51) Int. Cl.
   *H01L 23/538*   (2006.01)
   *H01L 23/00*    (2006.01)
   *H01L 21/683*   (2006.01)
   *H01L 21/48*    (2006.01)
   *H01L 21/56*    (2006.01)
   *H01L 21/78*    (2006.01)

(52) U.S. Cl.
   CPC .......... *H01L 21/561* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/73* (2013.01); *H01L 25/165* (2013.01); *H01L 2221/68354* (2013.01); *H01L 2221/68372* (2013.01); *H01L 2224/214* (2013.01); *H01L 2224/73277* (2013.01)

(58) Field of Classification Search
   USPC ....................................................... 257/433
   See application file for complete search history.

PACKAGE STRUCTURE FOR SEMICONDUCTOR DEVICE AND MANUFACTURING METHOD THEREOF

CROSS REFERENCE TO RELATED APPLICATIONS

This Non-provisional application claims priority under 35 U.S.C. § 119(a) on Patent Application No. 107130072 filed in Republic of China on Aug. 29, 2018, the entire contents of which are hereby incorporated by reference.

BACKGROUND

1. Technical Field

The present invention generally relates to a package structure for semiconductor device and its manufacturing method, and more particularly, to a 3D stacked package structure for semiconductor device and its manufacturing method.

2. Description of Related Art

With the rapid development of science and technology, the multifunctional devices have been widely used in daily life. It integrates multiple uses or functions into a single device, such as a smart phone. In addition to communication and network data transmission, it also has identification or sensing functions.

To perform the combined functions in a single device, there are usually more than two chips or dies needed in a single device, to perform their functions separately; such as: including a controller die and another sensor die. The controller die maintains the system whole operation, while the sensor die deals with the sensing function. And to further reduce the volume, the controller die and the sensor die can be integrated in a single package. In order to accommodate and integrate a plurality of dies in a single package, the package structure of 3D stacking is commonly used in the previous technology.

FIG. 1 is the section view of package structure unit 1-1 of 3D stacking in the previous technology. Referring to FIG. 1, each unit 1-1 of 3D stacking package structure in the previous technology includes a substrate 10, a controller die 11 and a sensor die 12. Based on 3D stacking method, it firstly disposes the controller die 11 on the substrate 10, and then disposes the sensor die 12 on the controller die 11. More specifically, in the 3D stacking method of previous technology, the controller die 11 attaches or connects its back surface 112 to the first surface 101 of substrate 10; similarly, the sensor die 12 also attaches or connects its back surface 122 to the active surface 111 of controller die 11. In other words, the active surface 111 of controller die 11 and the active surface 121 of sensor die 12 are upward.

The active surface 111 of controller die 11 have a plurality of metal pads 113, which are the signal input/output interfaces of controller die 11. In order to enable the signal of controller die 11 to be further transmitted to the peripheral layer or other circuit components, the wire 13 is bonded on the metal pad 113 to further fan-out or fan-in the signal; while the setting of wire 13 is accomplished by the wire bonding process. Similarly, the active surface 121 of sensor die 12 also have a plurality of metal pads 123; and the wire 14 is also set respectively through the wire bonding process, for the signal fan-out/fan-in of the sensor die 12.

However, as shown in FIG. 1, in the 3D stacking method of previous technology, the sensor die 12 is connected on the active surface 111 of the controller die 11, which occupies quite a lot area of active surface 111, and thus quizzes the space for wire 13 setting and circuit layout.

Besides, the active surface 111 and 121 of two dies are toward the same direction (upward), which means that the different wires 13 and 14 must plan their circuit layout in the same direction, so that the circuit layout of wires 13 and 14 will restrict or interfere with each other.

Furthermore, the wires 13 and 14 are of certain height because they are connected or set in a wire bonding process. In addition, the thickness of substrate 10 should also be taken into account when estimating the overall height of package structure unit 1-1.

Due to the above limitations, it is difficult for designers to reduce the overall height of the package structure unit 1-1 of the previous technology, which leads to the difficulty in the miniaturization of devices and terminal products adopting the package structure unit 1-1. This is the defect and technical problem of the package structure of previous technology.

Therefore, it is necessary to provide a technical solution that can effectively reduce the overall height of the integrated 3D stacking package structure of a plurality of dies, and provide more sufficient wiring space and design flexibility of circuit, so as to overcome the above technical problems in the previous technology.

SUMMARY OF THE INVENTION

For the existing problems in the previous technology: the overall height of 3D stacking package structure difficult to reduce, mutual interference of circuit layout, and limitation technical problems, the present invention is to provide a technical scheme, which uses the package structure of back to back stacking, to connect the back surface of two dies (the first die and the second die) on the first surface and second surface of the same conductive layer (the first conductive layer). Based on the back-to-back stacking setup described above, the active surfaces of the two dies are oriented in different directions (to the upper side and lower side of the first conductive layer, respectively), so that the two dies can focus on the space below and above the first conductive layer, and plan their fan-in/fan-out circuit layout respectively.

The technical scheme of the present invention is further elaborated. The present invention provides a package structure of a semiconductor device, each unit of which includes a first conductive layer, a second conductive layer, a first die, a second die, a plurality of first blind hole pillars and a conductive structure. The first conductive layer and the second conductive layer are provided with a relatively disposed first surface and a second surface, and the second conductive layer is located below the first surface of the first conductive layer. The first die has one active surface and one back surface, the active surface has a plurality of metal pads, and the first die is disposed on the first surface of the first conductive layer with its back surface. The second die is provided with one active surface and one back surface, the active surface has a plurality of metal pads, and the second die is disposed on the second surface of the first conductive layer with its back surface. The first blind hole pillar is disposed between the second conductive layer and the corresponding metal pad of the first die, to transmit the signal of the first die. The conductive structure is electrically connected to the first conductive layer and the corresponding metal pad of the second die, to transmit the signal of the second die. The first conductive layer and the second conductive layer have predetermined circuit layout patterns respectively. The first conductive layer, the second conductive layer, the first die, the second die, the first blind hole pillar and the conductive structure are covered in a dielectric material.

In one embodiment, wherein the package structure further includes a first adhesive layer and a second adhesive layer, and the first die and the second die are respectively disposed to the first surface and the second surface of the first conductive layer through the first adhesive layer and the second adhesive layer.

In one embodiment, wherein the second die is an optical sensor chip with a sensing area on the active surface, and the dielectric material has a selective opening corresponding to parts of the sensing area to expose the sensing area.

In one embodiment, wherein the package structure also includes a plurality of first interlayer pillars, which are disposed between the first conductive layer and the second conductive layer to transmit the signals between the first conductive layer and the second conductive layer.

In one embodiment, wherein the package structure also includes a plurality of conductive pillars, which are disposed on the first surface of the second conductive layer, and connected to a plurality of corresponding external conductive bumps, which are further connected to an external circuit substrate.

In one embodiment, wherein the external conductive bumps of the package structure have an extension portion respectively, and the extension portion is a selective displacement of the conductive pillar.

In one embodiment, wherein the conductive structure of the package structure includes a plurality of second interlayer pillar, a third conductive layer and a plurality of second blind hole pillars to form a redistribution layer circuit to transmit the signal of the second die.

In one embodiment, wherein the third conductive layer of the package structure is located above the first conductive layer and the active surface of the second die, and the second interlayer pillar is disposed between the third conductive layer and the first conductive layer, and the second blind hole pillar is disposed between the corresponding metal pads of the third conductive layer and the second die.

In one embodiment, wherein the conductive structure of the package structure includes a plurality of wires. One end of each wire is bonded to the second surface of the first conductive layer, and the other end of each wire is bonded to the corresponding metal pad of the second die to transmit the signal of the second die.

The present invention also provides a manufacturing method for a package structure of a semiconductor device, including the following steps: firstly, a first carrier is provided. A first conductive layer having a first surface and a second surface is then formed on the first carrier. A plurality of first dies having an active surface and a back surface are then disposed on the first surface of the first conductive layer. A first dielectric layer is formed to cover the first die and the first conductive layer. Then, a plurality of first blind holes are formed in the first dielectric layer to expose the corresponding metal pad of the active surface of the first die respectively. Then, a second conductive layer with a first surface and a second surface is formed on the first dielectric layer, and the second conductive layer fills the first blind hole downward to form a plurality of first blind hole pillars. A second dielectric layer is then formed to cover a second conductive layer to form a semi-finished product of package structure. Then, turn the semi-finished product of the package structure up and down, and connect a second carrier under the second dielectric layer after turning, and remove the first carrier. The second die having an active surface and a back surface is then disposed on the second surface of the first conductive layer, in which the first conductive layer is located on the uppermost layer of the overturned semi-finished product of package structure. A conductive structure is then formed to electrically connect the corresponding metal pad of the first conductive layer and the active surface of the second die. A third dielectric layer is formed to cover the first conductive layer, the second die and the conductive structure. After that, remove the second carrier. Finally, the package structure is cut into a plurality of package units.

The manufacturing method according to one embodiment of the present invention, the area of the first carrier and the second carrier is the multiple times of a single wafer, and the first die and the second die are cut from a plurality of wafers.

The manufacturing method according to one embodiment of the present invention, the second die is an optical sensor chip, which has an active surface with a sensing area, and an opening is formed selectively in the third dielectric layer to expose the sensing area.

The manufacturing method according to one embodiment of the present invention, before the step of forming a first dielectric layer on the first conductive layer and the first dies, it further includes the step of forming a plurality of first interlayer pillars on the first surface of the first conductive layer, that is connected to the second surface of the later formed second conductive layer.

The manufacturing method according to one embodiment of the present invention, after the step of forming the second conductive layer on the first dielectric layer, it further includes the step of forming a plurality of conductive pillars on the first surface of the second conductive layer, and after completing the manufacture of package structure, the conductive pillars are respectively connected to a plurality of corresponding external conductive bumps.

The manufacturing method according to one embodiment of the present invention, the step of forming the conductive structure includes the step of forming a plurality of second interlayer pillars, a third conductive layer and a plurality of second blind hole pillars to consist of a redistribution layer circuit, to electrically connect the metal pads of each second die to the first conductive layer.

The manufacturing method according to one embodiment of the present invention, the step of forming the second interlayer pillars, the third conductive layer and the second blind hole pillars includes: firstly, forming the second interlayer pillars on the second surface of first conductive layer. Then, form a third dielectric layer to cover the first conductive layer, the second dies and the second interlayer pillars. Then, a plurality of second blind holes are formed in the third dielectric layer to expose the corresponding metal pad of the second die. Then, a third conductive layer is formed on the third dielectric layer, and the third conductive layer fills the second blind hole downward to form the second blind hole pillar, wherein the third conductive layer connects with the second interlayer pillar.

The manufacturing method according to one embodiment of the present invention, the step of forming a conductive structure includes performing a wire bonding process to engage one end of a plurality of wires to the second surface of the first conductive layer, and to engage the other end to a corresponding metal pad of the active surface of each second die.

Based on the above technical characteristics, in the package structure of the present invention, the first die is disposed in the space below the first conductive layer, and the first blind hole pillar is connected to the second conductive layer as its fan-in/fan-out redistribution layer circuit. In addition, the second die is in the space on top of the first conductive layer, with the second blind hole pillar to connect to the third conductive layer, and the second interlayer pillar is connected to the first conductive layer as its fan-in/fan-out redistribution layer circuit (or, in another embodiment, the second die is connected directly to the first conductive layer with wires as its fan-in/fan-out circuit). Besides, the two dies dispose their fan-in/fan-out circuits in the space below and above the first conductive layer respectively, thus eliminating the mutual restriction and interference, which can greatly improve the flexibility of wiring design and effectively reduce the overall height of 3D stacking package structure. This is the main technical effect or function of the present invention, which can overcome the technical problems existing in previous technology.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

FIGS. 4A-1 to 4C-2 are cross-sectional views of a unit of the package structure according to various cases of the first embodiment of the present invention.

FIGS. 6A-1 to 6B-2 are cross-sectional views of a unit of the package structure according to various cases of the second embodiment of the present invention.

DETAILED DESCRIPTION

Reference will now be made to the drawings to describe various inventive embodiments of the present disclosure in detail, wherein like numerals refer to like elements throughout.

Figure 2A:
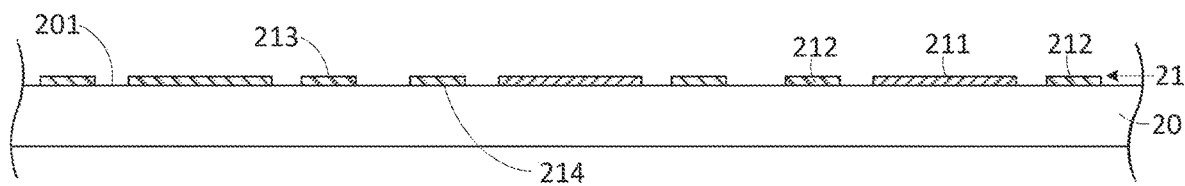
FIGS. 2A to 2K and 3A to 3H are schematic diagrams showing a manufacturing method of a package structure according to a first embodiment of the present invention.

FIGS. 2A to 2K and 3A to 3H are the schematic diagram showing a manufacturing method for a semiconductor package according to the first embodiment of the present invention. Referring to FIG. 2A, firstly, a first carrier 20 is provided, which may be a metal plate or an insulating plate. If the first carrier 20 adopts the metal plate, it could be copper. Additionally, if the first carrier 20 adopts the insulating plate, it could be ceramics, epoxy resin, polyimide, cyanate ester, carbon fiber, glass fiber, and epoxy resin mixed texture.

In the conventional wafer type processing, only the dies formed in a single wafer can be packaged at the same time, which is time-consuming and has many processing limitations. Compared with the conventional wafer type package processing, the present invention adopts the panel type package processing, wherein the area of the first carrier 20 is multiple times that of a single wafer. Accordingly, the large-sized first carrier 20 of the present invention can package all dies cut from a plurality of wafers at the same time, and can effectively save the manufacturing time.

Next, the first conductive layer 21 is formed on the first surface 201 of the first carrier 20. The first conductive layer 21 has a relatively disposed first surface 213 and second surface 214, which may include the conductive metal material, such as the copper, silver, nickel or an alloy thereof. The exposure and development process can be performed in combination with the additional photoresist layer (not shown in the figure) and the electroplating process can be performed to form the patterned first conductive layer 21 on the first surface 201 of the first carrier 20.

The patterned first conductive layer 21 has a predetermined circuit layout pattern, wherein the first conductive layer 21 of each unit may include the die-placed area 211 and circuit part 212 which are electrically isolated from each other. However, in the manufacturing method of the present invention, the circuit layout pattern of the first conductive layer 21 is not limited to the electrical connection mode shown in the schematic diagram. In other embodiments, the parts of the first conductive layer 21 may also have other electrical connections and thus have different circuit layout patterns. Alternatively, for the first conductive layer 21 of the same embodiment, the sections at different locations will also show different electrical connections.

Figure 2B:
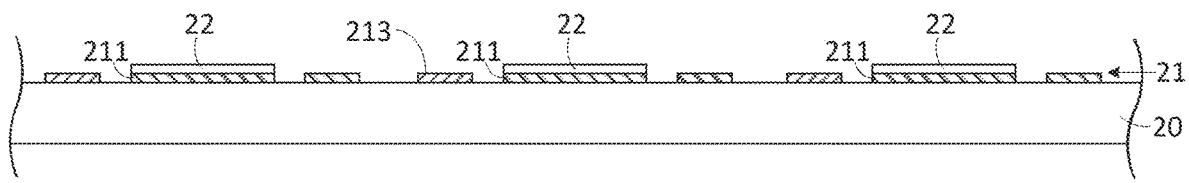

Next, referring to FIG. 2B, a first adhesive layer 22 is formed on the first surface 213 of the die-placed area 211 of each unit of the first conductive layer 21. The material of the first adhesive layer 22 may be a polymer adhesive material or a heat-dissipating metal material.

Figure 2C:
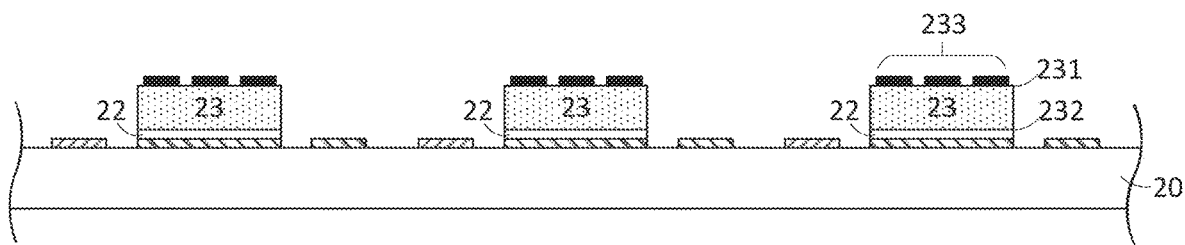

Next, referring to FIG. 2C, each first die 23 cut from a plurality of wafers is attached or connected to the corresponding first adhesive layer 22. The first die 23 may, for example, be a controller die or a processor die that acts as the master control in the overall circuit.

More specifically, each first die 23 has an active surface 231 (or front side) and a back surface 232. The active surface 231 has a plurality of metal pads 233. Each metal pad 233 can also be connected to a conductive structure such as the blind hole pillar or to other forms of electrical connection paths (e.g. wires) to fan-in/fan-out the signals of the first die 23. In addition, the back surface 232 is attached to the first adhesive layer 22.

Figure 2D:
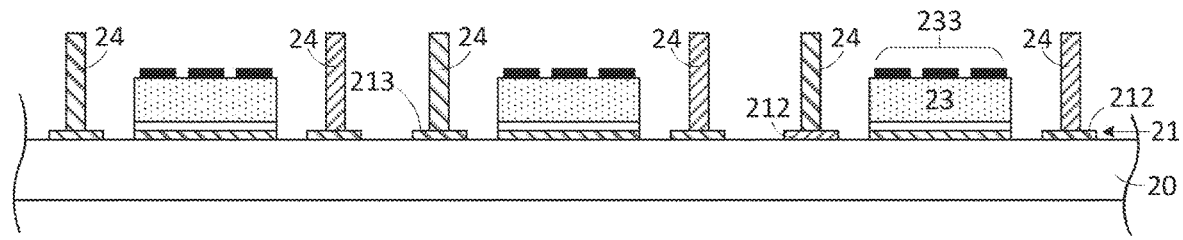
Figure 2E:
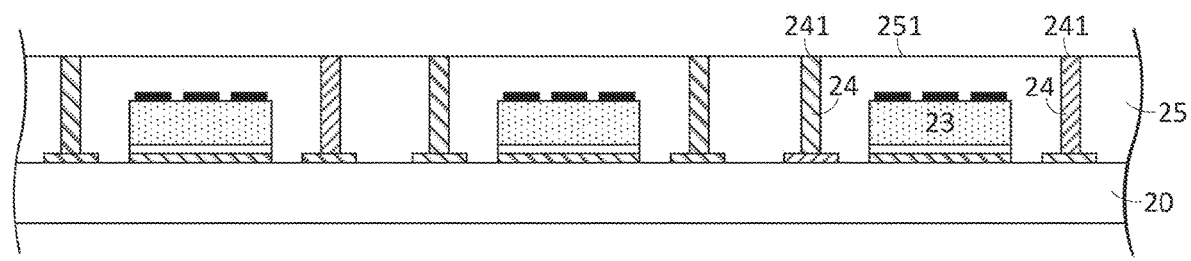

Next, referring to FIG. 2D, the first interlayer pillar 24 upward is formed respectively on the first surface 213 of the circuit part 212 of the first conductive layer 21. The first interlayer pillar 24 is the conductive metal material, such as the copper; it can be formed by metal plating process. Furthermore, the height of the first interlayer pillar 24 is slightly higher than that of the metal pad 233 of the first die 23.

The technical effects or functions of the first interlayer pillar 24 are as follows: firstly, as an electrical connection path between different conductive layers (the first conductive layer 21 and the second conductive layer 26 formed in the subsequent steps), it could transmit the signal between the two conductive layers mentioned above. Secondly, it can be used as the mechanical support between the two conductive layers. Next, referring to FIG. 2E, it shall perform the molding process (also known as "compression molding" or "mold filling" process) to form the first dielectric layer 25. The material of the first dielectric layer 25 is the insulating material, such as Novolac-based resin, epoxy-based resin or silicone-based resin. When the insulating material is in liquid state, it is filled between the first carrier 20, the first interlayer pillar 24 and the first die 23 respectively. After curing, the insulating material forms the first dielectric layer 25, which covers each first die 23, first interlayer pillar 24 and first conductive layer 21. Then, through the grinding process, the first end surface 241 of each first interlayer pillar 24 is exposed from the first surface 251 of the first dielectric layer 25 respectively.

Figure 2F:
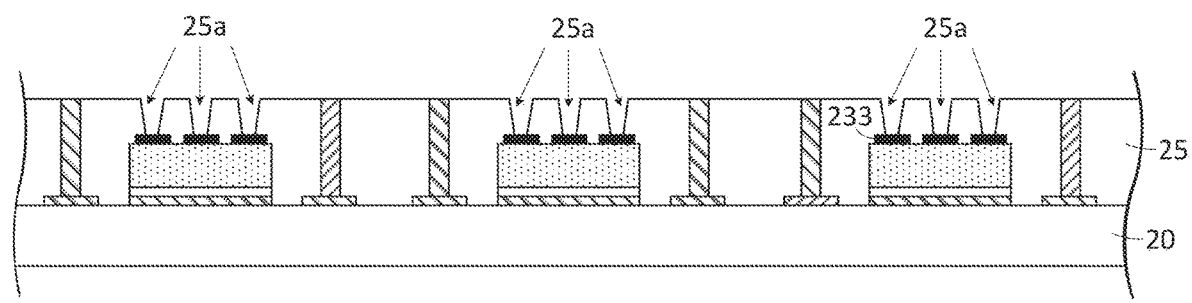

Next, referring to FIG. 2F, to perform the laser drilling process to form a plurality of first blind hole 25a in the first dielectric layer 25. Each first blind hole 25a corresponds to each metal pad 233 of the first die 23 to expose each metal pad 233 respectively.

Figure 2G:
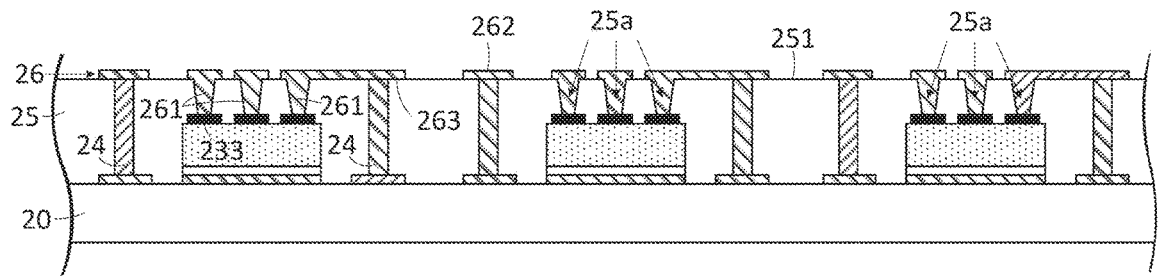

Next, referring to FIG. 2G to form a second conductive layer 26 on the first surface 251 of the first dielectric layer 25. The second conductive layer 26 has a relatively disposed first surface 262 and second surface 263, which may be of the same or different material as the conductive metal material of the first conductive layer 21, such as the copper, silver, nickel or an alloy thereof. In addition, similar to the formation mode of the first conductive layer 21: the exposure and development process can be carried out in conjunction with the additional photoresist layer (not shown in the figure), to form the conductive metal material selectively on the first surface 251 of the first dielectric layer 25; the conductive metal material fills each first blind hole 25a of the first dielectric layer 25 downward, to form a cylindrical first blind hole pillar 261 and fill each first blind hole 25a. Furthermore, each first blind hole pillar 261 is connected to each metal pad 233 of the first die 23 respectively. The technical effect or function of the first blind hole pillar 261 is to serve as the electrical connection path between the metal pad 233 of the first die 23 and the second conductive layer 26 to fan-in/fan-out the signal of the first die 23.

More specifically, the second conductive layer 26 also has a predetermined circuit layout pattern (different from or identical to the circuit layout pattern of the first conductive layer 21). The second surface 263 of the second conductive layer 26 of each unit is connected to the first interlayer pillar 24 and the first blind hole pillar 261 respectively.

Figure 2H:
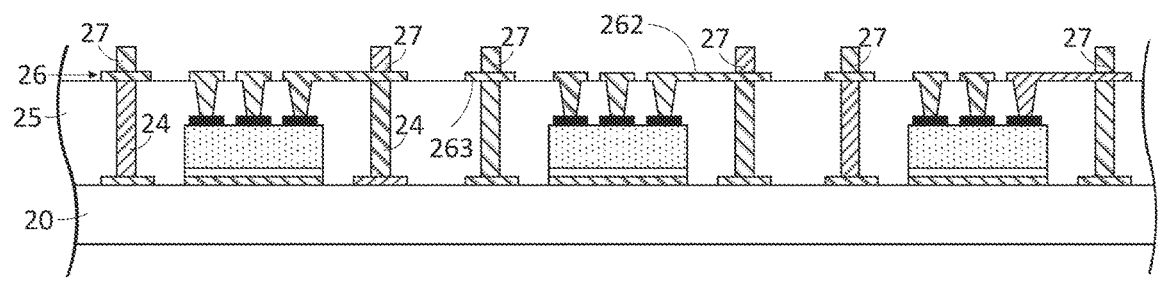

Next, referring to FIG. 2H, form a plurality of conductive pillar 27 upward on the first surface 262 of the second conductive layer 26, to fan-in/fan-out the signal of the first die 23. The material of conductive pillar 27 may be the same or different from that of first interlayer pillar 24, such as copper; it can also be formed through metal plating process.

Figure 2I:
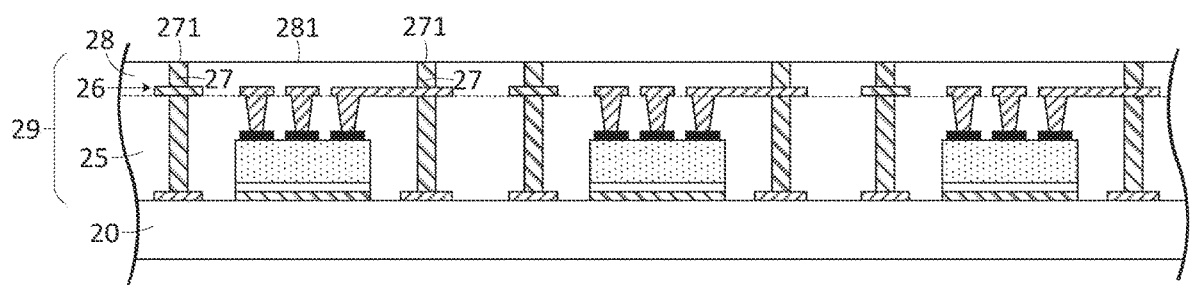

Next, referring to FIG. 2I, form the second dielectric layer 28 on the first dielectric layer 25 and the second conductive layer 26. The material of the second dielectric layer 28 is the same as that of the first dielectric layer 25. It is an insulating material, such as the Novolac-based resin, epoxy-based resin or silicone-based resin. The above materials are filled on top of the first dielectric layer 25 and the second conductive layer 26 and between each conductive pillar 27 in the molding process. The first end surface 271 of the conductive pillar 27 can be exposed from the first surface 281 of the second dielectric layer 28 respectively, after the material is cured and grinded.

Since the second dielectric layer 28 is made of the same material as the first dielectric layer 25, it is also possible to combine the second dielectric layer 28 with the first dielectric layer 25 as a single dielectric layer in the embodiment. In other words, it does not form another dielectric layer with different materials; instead, the mold is filled with the same material, so that the height of the first dielectric layer 25 is raised to level with the first end side 271 of conductive pillar 27, and the first end side 271 of conductive pillar 27 is exposed.

In the first embodiment, when performing the package structure manufacturing method so far, each structural layer formed in the foregoing steps (including the first conductive layer 21, the first adhesive layer 22, the first die 23, the first interlayer pillar 24, the first dielectric layer 25, the second conductive layer 26, the conductive pillar 27 and the second dielectric layer 28) can be collectively referred to as the "package structure semi-finished product 29".

Figure 2J:
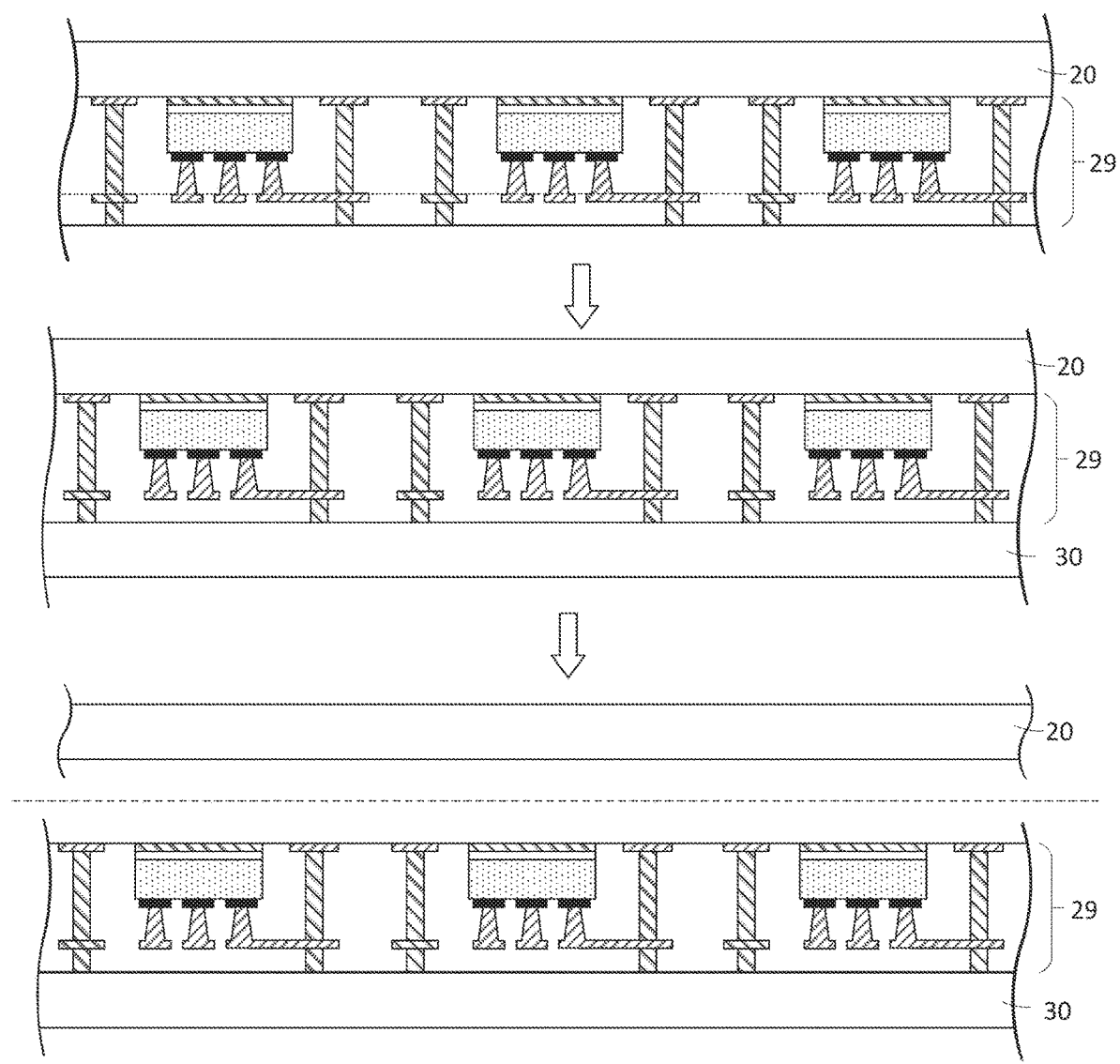

Next, referring to FIG. 2J, vertically turn the first carrier 20 and the package structure semi-finished product 29 (i.e. turning up and down). However, in other embodiments, if there is no special requirement in the process, the package structure semi-finished product 29 may not be turned.

Next, the turned package structure semi-finished product 29 is connected to another second carrier 30. After that, the first carrier 20 is removed from the package structure semi-finished product 29 after turning.

Figure 2K:
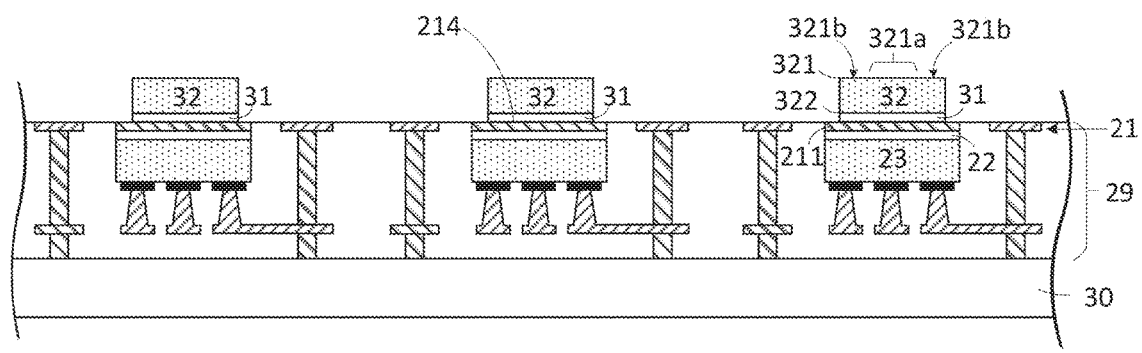

Next, referring to FIG. 2K, a second adhesive layer 31 is formed on the second surface 214 of the first conductive layer 21. Similar to or different from the first adhesive layer 22, the second adhesive layer 31 can also be the polymer adhesive material or heat-dissipating metal material.

More specifically, the first conductive layer 21 is located at the top of the package structure semi-finished product 29 after turning up and down vertically. The second adhesive layer 31 correspondingly forms or attaches to the second surface 214 of the die-placed area 211 of the first conductive layer 21. In addition, in the step shown in FIG. 2B, the first adhesive layer 22 has been formed on the first surface 213 of die-placed area 211 of the first conductive layer 21. Therefore, the second adhesive layer 31 and the first adhesive layer 22 are formed on the opposite sides (reverse sides) of the die-placed area 211 of the first conductive layer 21 respectively, which provides the basic prototype of the package structure of the back-to-back stacking of the present invention.

The second die 32, cut from a plurality of wafers, is then connected or attached to the corresponding second adhesive layer 31. As opposed to the first die 23, which acts as the master control, the second die 32 receives the instructions from the first die 23 to perform specific functions or special applications.

More specifically, a semiconductor device with the package structure of the present invention may be applied to a sensing module of a wearable device or the Internet of Things, such as an optical sensing module. In view of this application path, the second die 32 of the embodiment may be an optical sensor chip. The second die 32 may have a relative disposed active surface 321 (or front side) and back surface 322. Its active surface 321 has a sensing area 321a to receive the external light and sense the external objects. Moreover, it has an active surface 321 and several metal pad areas 321b to provide a plurality of metal pads (not shown in the figure). In addition, the back surface 322 of the second die 32 is connected to the second adhesive layer 31.

The above steps of the package structure manufacturing method shown in FIG. 2A to 2K have been implemented to construct the infrastructure of the package structure of back-to-back stacking. The following steps of the manufacturing method of the first embodiment of the present invention shown in FIG. 3A to 3H shall be performed. Among them, FIG. 3A to 3G mainly illustrate the method of forming the conductive structure.

Figure 3A:
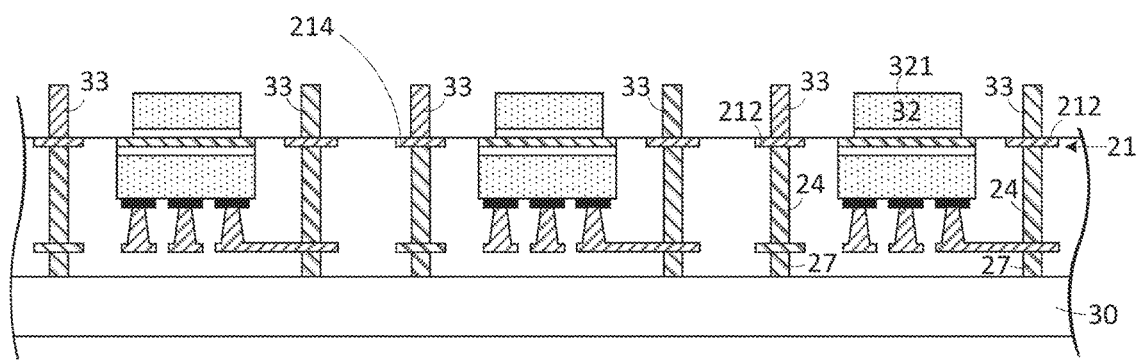

Firstly, referring to FIG. 3A, the steps of forming a conductive structure include the second surface 214 of circuit part 212 of the first conductive layer 21, and the cylindrical second interlayer pillar 33. The materials of the second interlayer pillar 33 may be the same or different from those of the first interlayer pillar 24 or conductive pillar 27, such as the copper; it can also be formed through a metal plating process. More specifically, the technical effects and functions of the second interlayer pillar 33 are as follows: as an electrical connection path between the first conductive layer 21 and the third conductive layer 36 formed in the subsequent steps, for the signal transmission between the above two conductive layers; furthermore, a mechanical support between the two conductive layers is provided.

In one embodiment, the second interlayer pillar 33 may be aligned on the same axis with the corresponding first interlayer pillar 24 and conductive pillar 27. However, the manufacturing method of the present invention is not limited to the aforesaid setting mode. In other embodiments, the second interlayer pillar 33, the first interlayer pillar 24 and the conductive pillar 27 may also deviate from each other and not on the same axis. In addition, the height of the second interlayer pillar 33 is slightly higher than the active surface 321 of second die 32.

In particular, equivalently, in other cases of the first embodiment, the step of forming the second interlayer pillar 33 as shown in FIG. 3A can be performed prior to the step of connecting the second die 32 as shown in FIG. 2K.

Figure 3B:
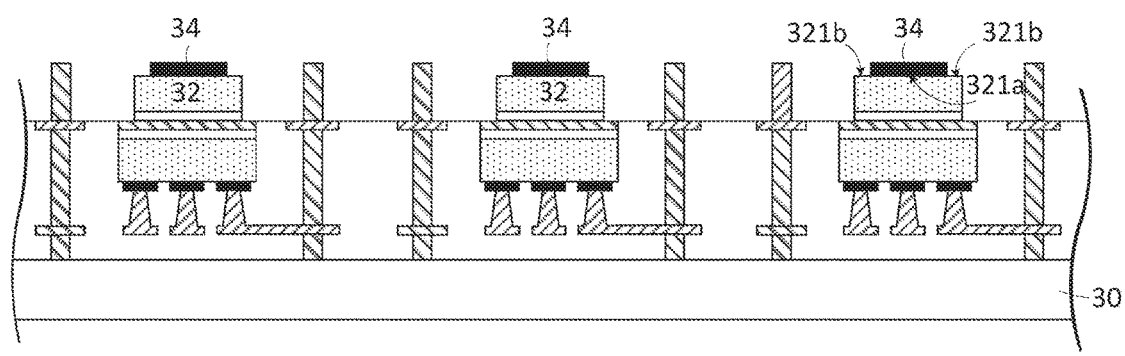

Next, referring to FIG. 3B, the steps for forming a conductive structure also include forming a protective layer 34 on sensing area 321*a* of each second die 32, which may be the insulating material or photoresist. It selectively covers the sensing area 321*a* of each second die 32 and exposes the metal pad area 321*b* through the exposure and development process. Alternatively, in other embodiments, the protective layer 34 may also be a protective film.

The technical effect or function of the protective layer 34 of the first embodiment is to provide the protection required for the sensing area 321*a* of each second die 32, to prevent the sensing area 321*a* from being damaged in the subsequent steps.

Figure 3C:
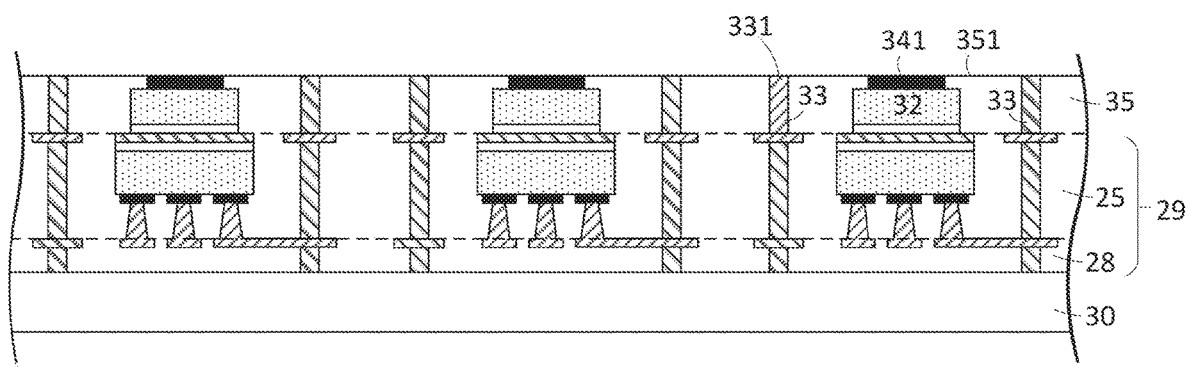

Next, referring to FIG. 3C, the steps of forming the conductive structure also include the execution of the molding process, which is to inject the liquid molding materials into the semi-finished product 29 of package structure, between each second die 32 and each second interlayer pillar 33 to form the third dielectric layer 35, and the third dielectric layer 35 formed covers the side wall of the protective layer 34. The third dielectric layer 35 is made of the same material as the first dielectric layer 25 and the second dielectric layer 28, which may be the insulating materials such as Novolac-based resin, epoxy-based resin or silicone-based resin. After curing, the materials are grinded so that the first surface 341 of each protective layer 34 and the first end surface 331 of each second interlayer pillar 33 are exposed respectively from the first surface 351 of the third dielectric layer 35. Since the material of the third dielectric layer 35 is the same as that of the first dielectric layer 25 and the second dielectric layer 28, the above three dielectric layers can be combined as a single dielectric layer.

Figure 3D:
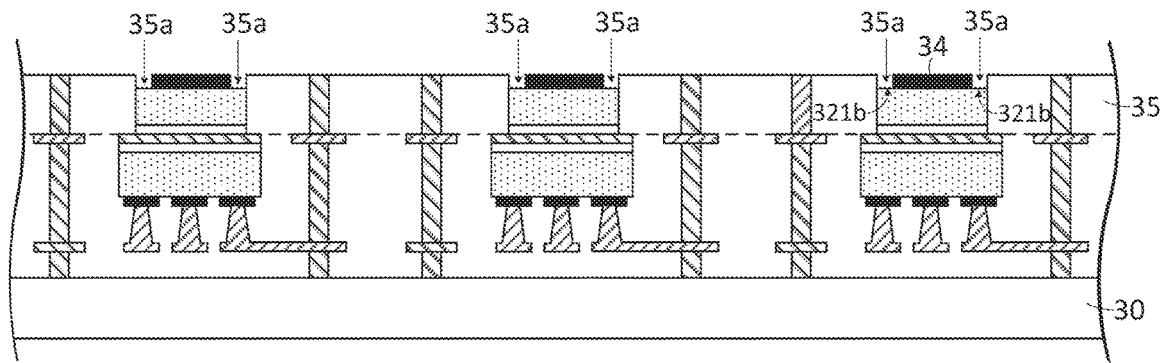

Next, referring to FIG. 3D, the steps forming the conductive structure also include the laser drilling process for the third dielectric layer 35, so as to form the second blind hole 35*a* on both sides of the protective layer 34 corresponding to the metal pad area 321*b*. Each second blind hole 35*a* exposes the metal pad of metal pad area 321*b* of second die 32.

Figure 3E:
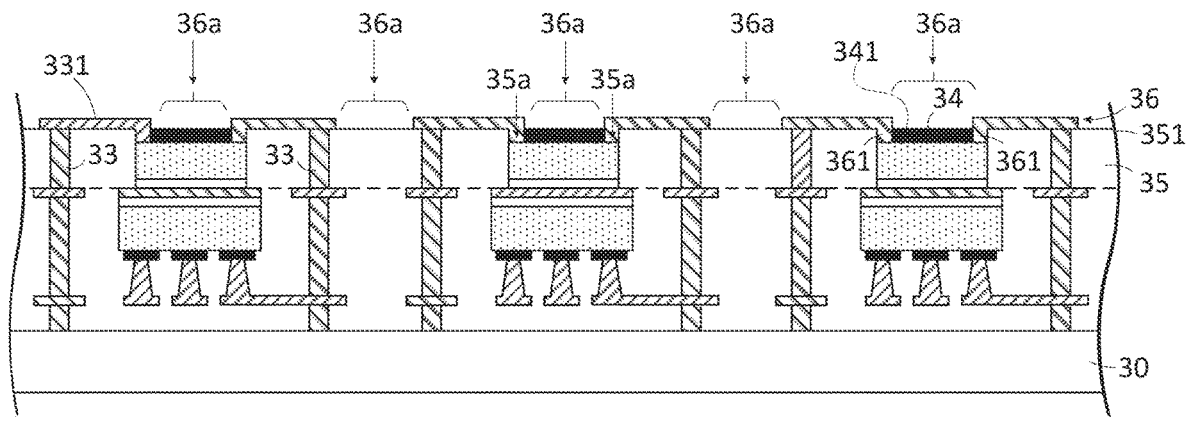

Next, referring to FIG. 3E, the steps forming a conductive structure also include forming a third conductive layer 36 on the third dielectric layer 35. Similar to the formation method of the first conductive layer 21 and the second conductive layer 26, the exposure and development process is performed in conjunction with the additional photoresist layer (not shown in the figure), and the electroplating process is performed to selectively form the conductive metal materials such as the copper, silver, nickel or an alloy thereof into the first surface 351 of third dielectric layer 35.

Similar to the first conductive layer 21 and the second conductive layer 26, the third conductive layer 36 also has a predetermined circuit layout pattern. Furthermore, the patterned third conductive layer 36 covers part of the first surface 351 of the third dielectric layer 35, fills each second blind hole 35*a* downward, and covers the first end surface 331 of the second interlayer pillar 33. In addition, the patterned third conductive layer 36 has a plurality of the openings 36*a*, which expose the protective layer 34 (with sensing area 321*a* below) and part of the first surface 351 of the third dielectric layer 35.

Furthermore, the third conductive layer 36 fills each second blind hole 35*a* downward to form a cylindrical second blind hole pillar 361. Then, each second blind hole pillar 361 is connected to each metal pad of the metal pad area 321*b* in the second die 32 respectively. The technical effect or function of the second blind hole pillar 361 is that it acts as an electrical connection path between the metal pad of second die 32 and the third conductive layer 36 to fan-in/fan-out the signals of the second die 32.

Figure 3F:
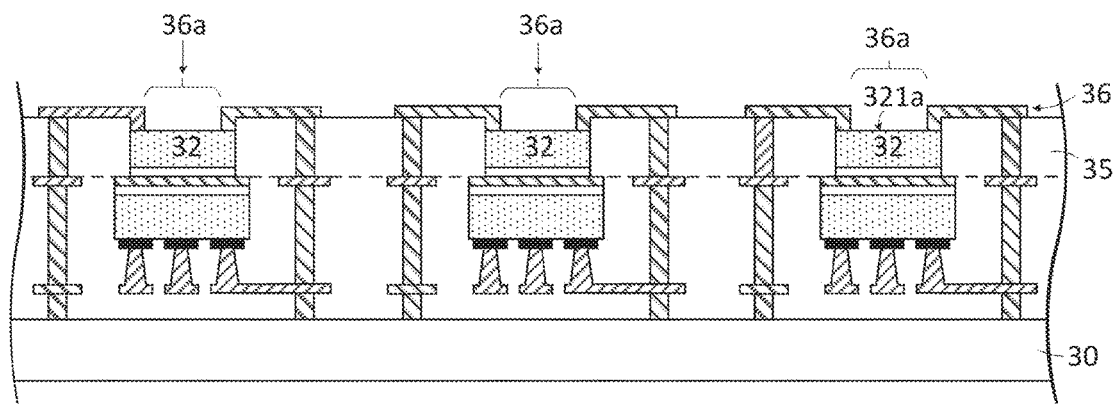

Next, referring to FIG. 3F, the steps forming a conductive structure also include the removal of parts of the protective layer 34 by etching or other cutting methods. After removing the protective layer 34, the opening 36*a* of the third conductive layer 36 can expose the sensing area 321*a* of each second die 32.

Figure 3G:
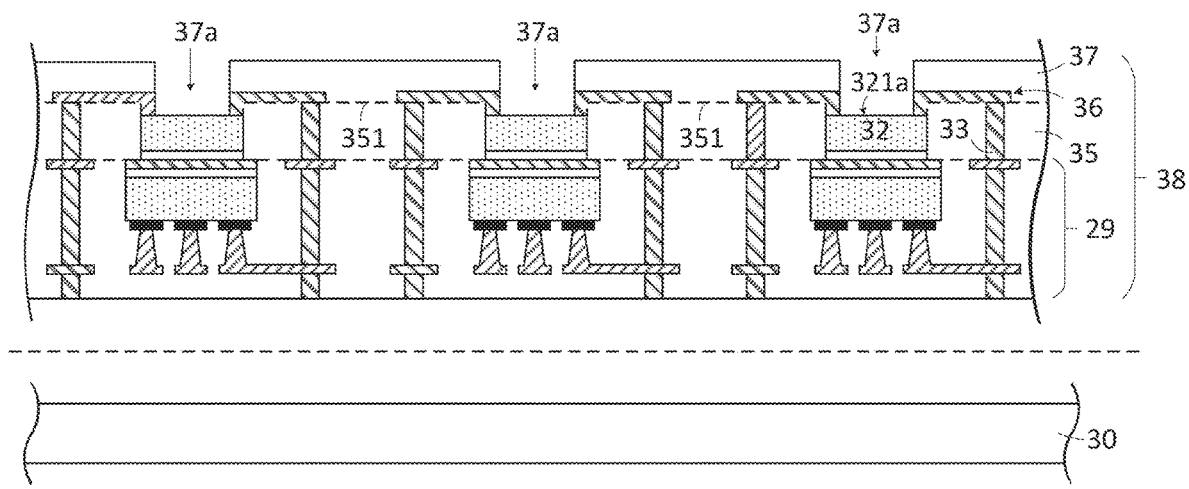

Next, referring to FIG. 3G the steps of forming a conductive structure also include forming a covering layer 37 on the third conductive layer 36. The covering layer 37 is the insulating material, which may, for example, be the photosensitive material. The covering layer 37 may cover part of the first surface 351 of the third conductive layer 36 and the third dielectric layer 35. Moreover, each opening 37*a* of the covering layer 37 exposes the sensing area 321*a* of each second die 32.

In particular, in other cases of the first embodiment, the step of forming the covering layer 37 may be omitted for the application to the second die 32 or the end product of other cases.

As mentioned above, the manufacturing method of the first embodiment is implemented so far, and all structural layers formed in the above steps (including the package structure semi-finished product 29, the second adhesive layer 31, the second die 32, the second interlayer pillar 33, the third dielectric layer 35, the third conductive layer 36 and the covering layer 37) can be collectively referred to as the "package structure 38". Then, the package structure 38 is separated from the second carrier 30.

Figure 3H:
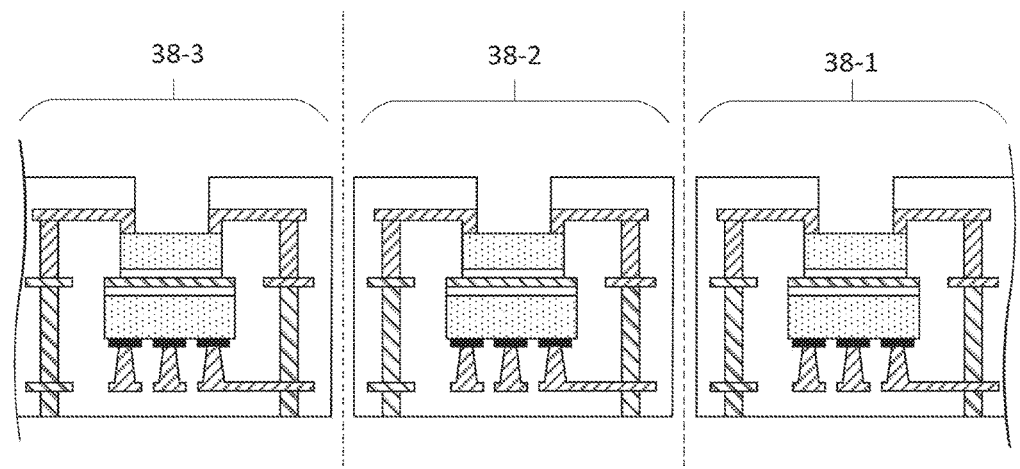

Next, referring to FIG. 3H, cut the separated package structure 38 into various units. For example, the package structure 38 is cut into the unit 38-1, unit 38-2, and unit 38-3, etc. by performing the laser cutting (or other cutting methods). For a detailed description of the structural characteristics of each package structure unit in the first embodiment, please refer to the following descriptions and illustrations in FIG. 4A-1 to 4C-2.

Figure 1:
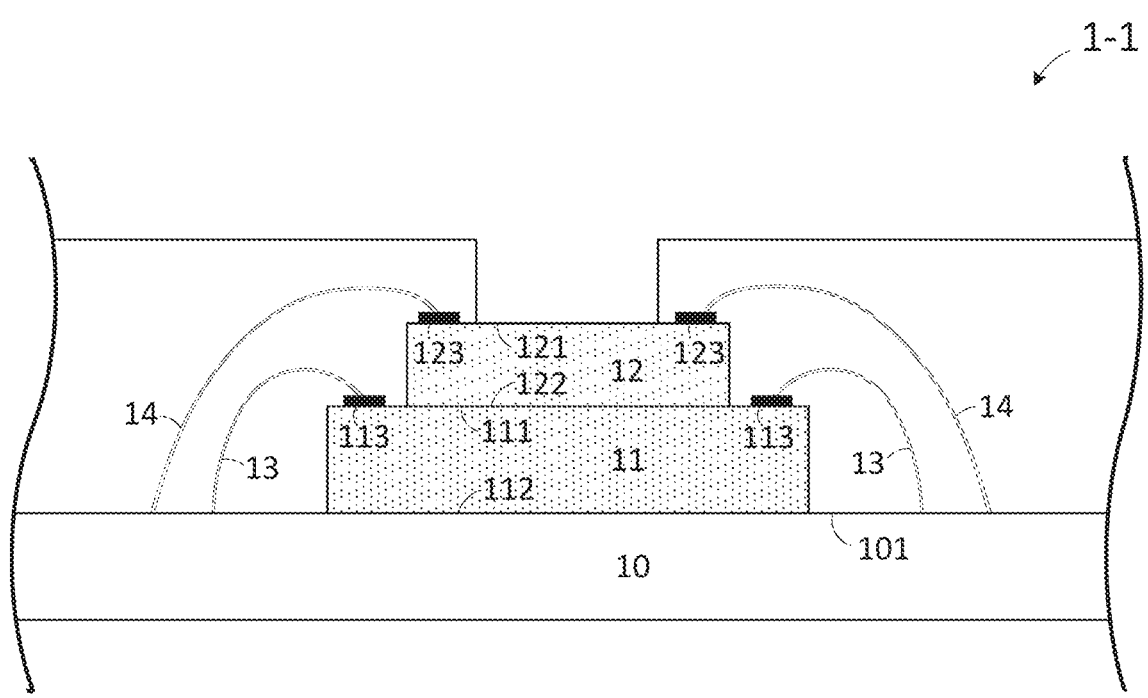
FIG. 1 is a cross-sectional view of a unit of a conventional 3D stacked package structure.
Figures 1, 4A:
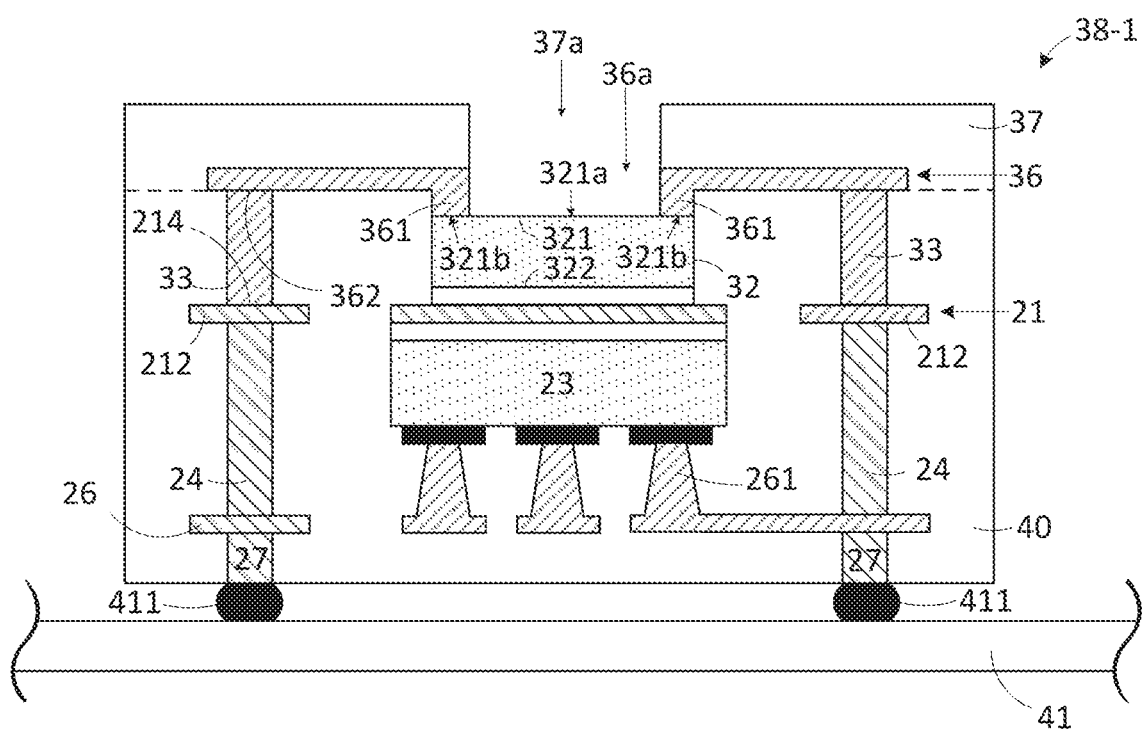

FIG. 4A-1 to 4C-2 show the section view of package structure units of different cases according to the first embodiment of the present invention. Refer to FIG. 4A-1, where a conductive layer with a conductive pillar (blind hole pillar and interlayer pillar) is used as the fan-out/fan-in redistribution layer circuit of second die 32.

The material of the third conductive layer 36 is the same or different from the material of the first conductive layer 21 or the second conductive layer 26, which could be the conductive metal material, such as the copper, silver, nickel or an alloy thereof. The third conductive layer 36 is disposed above the first conductive layer 21 and the second die 32, and slightly higher than the active surface 321 of the second die 32. In addition, the third conductive layer 36 is also a patterned conductive layer, which can have a predetermined circuit layout pattern and can selectively form an opening 36a above the sensing area 321a of corresponding second die 32, thus exposing the sensing area 321a of the second die 32, so as to facilitate the optical sensing of the second die 32.

Furthermore, the material of the second interlayer pillar 33 is the same or different from that of the first interlayer pillar 24. It is the conductive metal material, such as copper. The second interlayer pillar 33 is formed on the second surface 214 of the circuit part 212 of the first conductive layer 21, and extends upward to connect to the first surface 362 of the third conductive layer 36 respectively. Therefore, the second interlayer pillar 33 forms an electrical connection path between the third conductive layer 36 and the first conductive layer 21.

In one case, the second interlayer pillar 33 can be aligned with the first interlayer pillar 24 in the coaxial direction respectively (while in other cases, the second interlayer pillar 33 can be formed at different horizontal positions and deviate from the first interlayer pillar 24). Furthermore, the height of the second interlayer pillar 33 is slightly higher than the thickness of the second die 32.

In addition, the second blind hole pillar 361 is formed in the same step as the third conductive layer 36, so its material is the same as the third conductive layer 36, which may be the conductive metal materials, such as copper, silver, nickel or alloy thereof. Wherein, the second blind hole pillar 361 is formed on the first surface 362 of the third conductive layer 36, and extends downward to the corresponding metal pad of the metal pad area 321b of the second die 32 (not shown in the figure) respectively, and forms the electrical connection path between the second die 32 and the third conductive layer 36. In addition, the side of the second blind hole pillar 361 is cut to the opening 37a of the covering layer 37.

As mentioned above, the electrical connection path (361-36-33) formed by the third conductive layer 36 matched with the second blind hole pillar 361 and the second interlayer pillar 33 is regarded as the fan-out/fan-in redistribution layer circuit of the second die 32. Thus, the overall thickness of the package structure can be effectively reduced comparing with the conventional wire bonding package structure.

The electrical connection path (361-36-33) is formed by a conductive layer and a conductive pillar, which can effectively reduce the height of the package structure unit 38-1 of the first embodiment. Furthermore, a conductive layer and a conductive pillar by semiconductor processing of the first embodiment forms an electrical connection path (361-36-33), which eliminates the need for additional wire bonding process, thereby reducing the manufacturing cost of the package structure.

From the above, it can be seen that the main technical characteristics of the present invention are as follows: based on the setting mode of back-to-back stacking, the first die 23 and the second die 32 are respectively below and above the first conductive layer 21, and each has enough space to set its fan-out/fan-in circuits respectively, so as to meet the elastic design requirements of various circuits. Wherein, the first die 23 is dedicated to the space between the first conductive layer 21 and the second conductive layer 26, and the fan-out/fan-in redistribution layer circuit is composed of the first blind hole pillar 261 matched with the second conductive layer 26. Therefore, the second die 32 can be adequately dedicated to the above of the first conductive layer 21, and the fan-out/fan-in circuit composed of the second blind hole pillar 361, the third conductive layer 36, and the second layer interlayer pillar 33 with the first conductive layer 21.

Based on the above technical characteristics, the fan-out/fan-in circuits of the first die 23 and the second die 32 have their own layout space, thus avoiding the mutual interference. Therefore, it can overcome the constraint of fan-out/fan-in circuit layout of controller die 11 and sensor die 12 respectively in the previous technology. In addition, there is sufficient space above the second die 32 for the sensing area 321a of the second die 32 without interference from the fan-out/fan-in redistribution layer circuit of the first die 23. In this way, sufficient circuit layout space and design elasticity can be provided for the first die 23 and the second die 32 respectively, and the overall thickness of the package structure can be effectively reduced to meet the requirements of thin semiconductor package.

Figures 2, 4A:
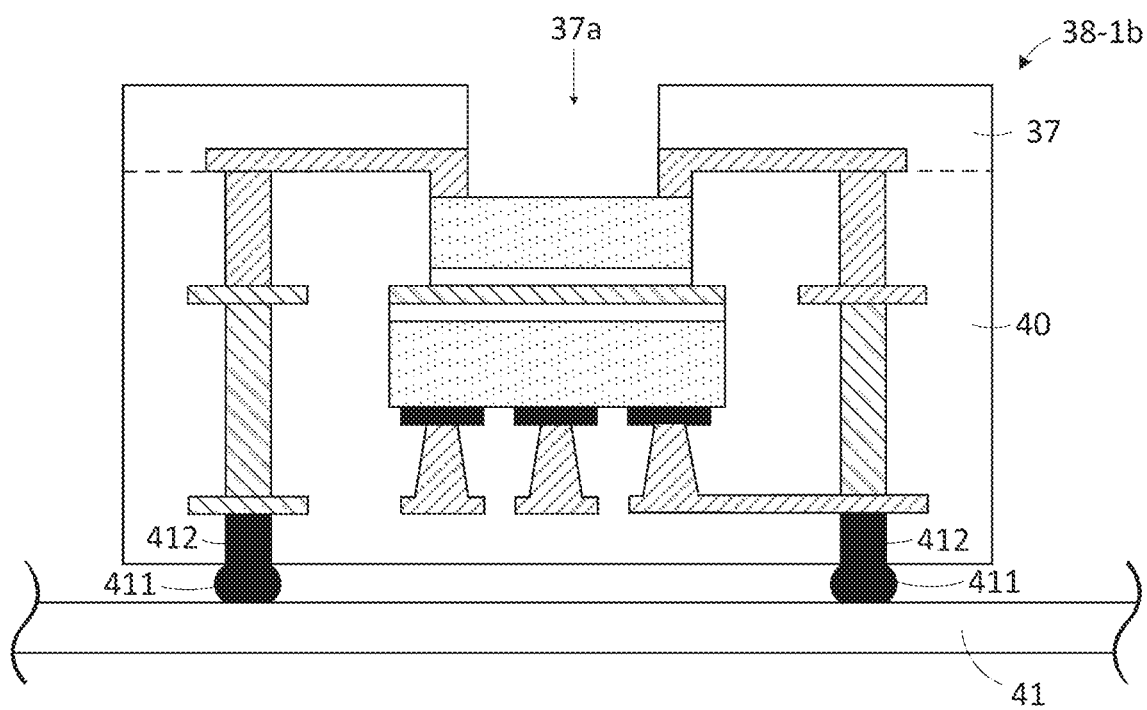

FIG. 4A-2 shows a section view of the package structure unit 38-1b of another case of the first embodiment of the present invention. Referring to FIG. 4A-2, the package structure unit 38-1b of this case is similar to the package structure unit 38-1 shown in FIG. 4A-1. The difference is that the package structure unit 38-1b of this case does not include the conductive pillar 27, but is replaced by an extension part 412 of the conductive bump 411.

Figures 1, 4B:
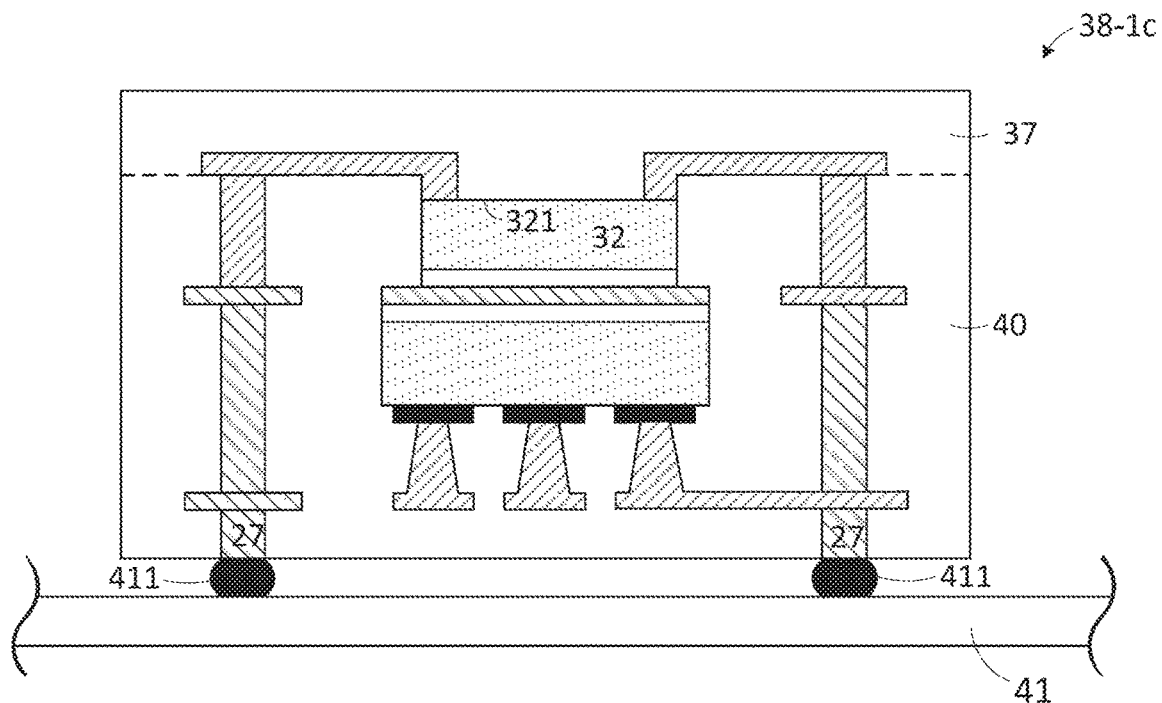
Figures 2, 4B:
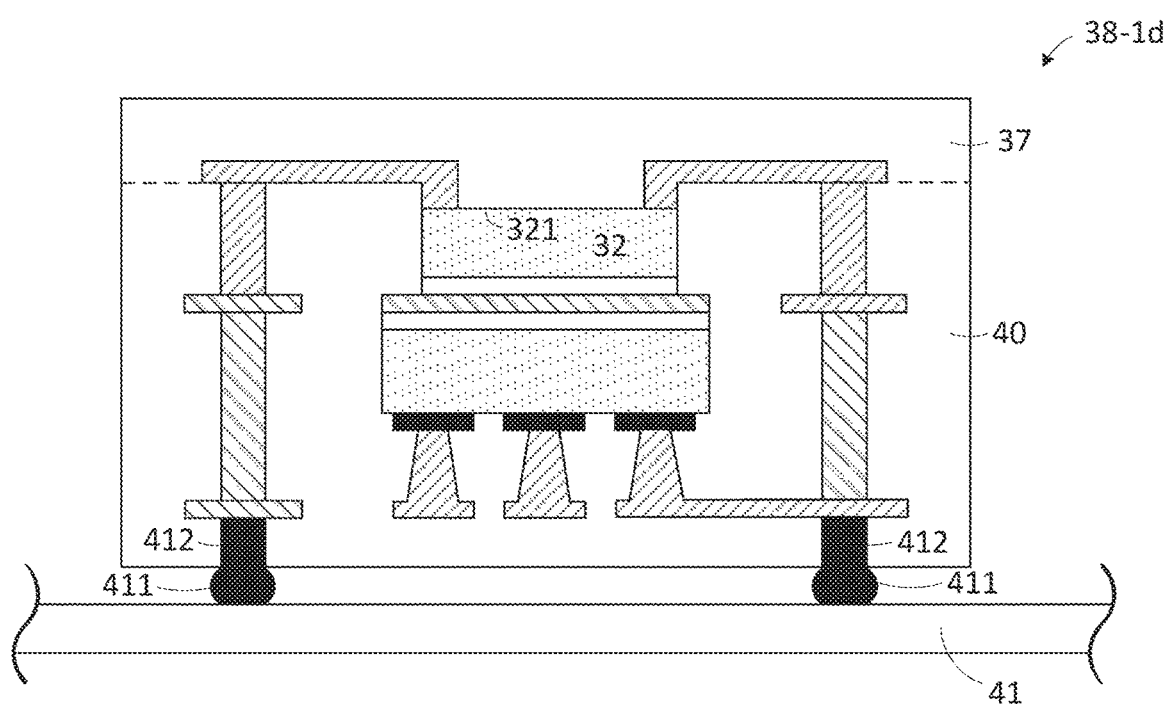

FIGS. 4B-1 and 4B-2 are the section views of the package structure units 38-1c and 38-1d of another case of the first embodiment of the present invention respectively. Referring to FIGS. 4B-1 and 4B-2, the package structure units 38-1c and 38-1d of this case are similar to the package structure unit 38-1 and 38-1b shown in FIGS. 4A-1 and 4A-2 respectively. The differences are as follows: the second die 32 of this case is the die other than optical sensor chip, which has no optical sensing function, so its active surface 321 does not need to be exposed to the outside. Therefore, there is no need to form an opening above the second die 32 for the covering layer 37 of this case.

Figures 1, 4C:
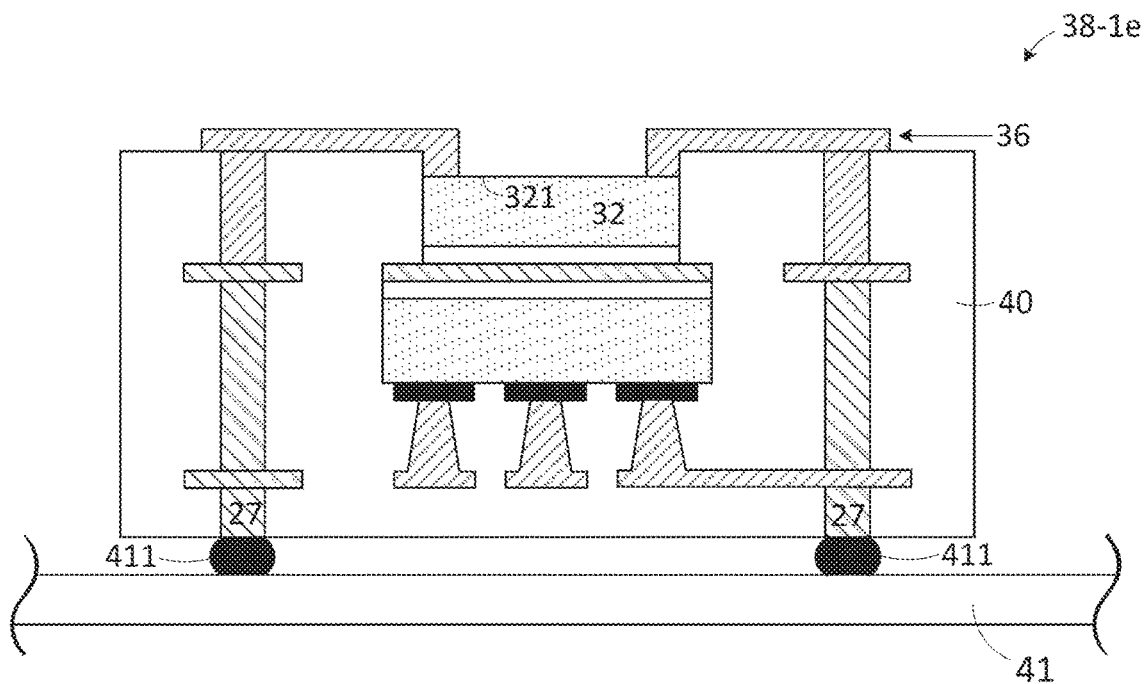
Figures 2, 4C:
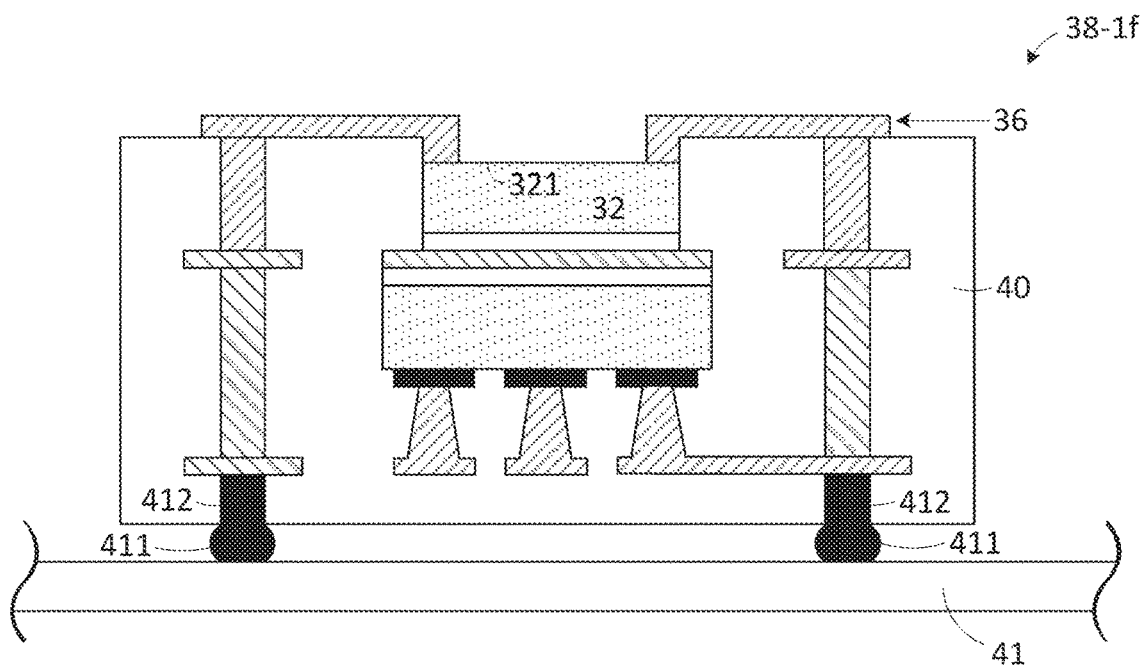

FIGS. 4C-1 and 4C-2 are the section views of the package structure units 38-1e and 38-1f according to another case of the first embodiment of the present invention respectively. Referring to FIGS. 4C-1 and 4C-2, the package structure units 38-1e and 38-1f of this case are similar to the package structure unit 38-1 and 38-1b shown in FIGS. 4A-1 and 4A-2 respectively. The differences are as follows: the dielectric material 40, the second die 32, and the third conductive layer 36 in this case need not form a covering layer.

Furthermore, the above steps of the package structure manufacturing method shown in FIG. 2A to 2K have been implemented to construct the package structure infrastructure of the back-to-back stacking. The following steps of the manufacturing method of the second embodiment of the present invention shown in FIG. 5A to 5F are performed.

Among them, FIG. 5A to FIG. 5F mainly show another method of forming the conductive structure.

Figure 5A:
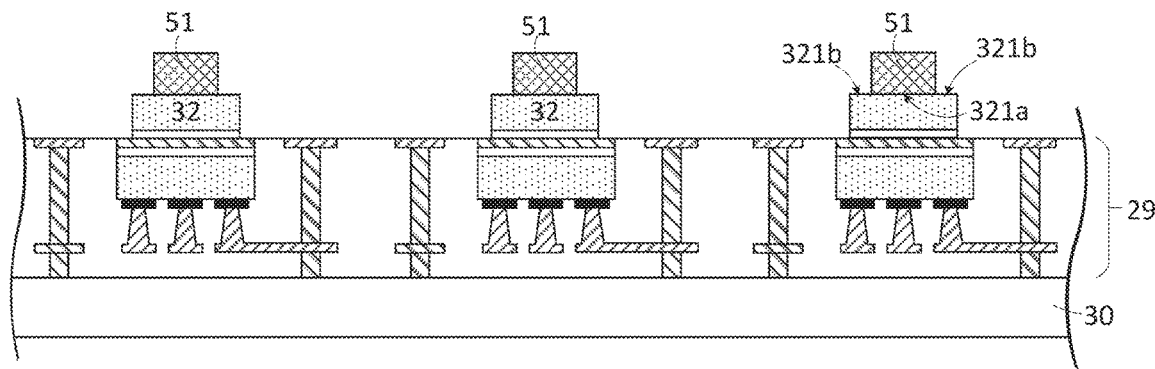
FIGS. 5A to 5F are schematic diagrams showing subsequent steps of the manufacturing method of the package structure according to a second embodiment of the present invention.

Firstly, referring to FIG. 5A, through the exposure and development process, the protective layer 51, which is made of insulation material or photoresist, selectively covers only the sensing area 321*a* of the active surface 321 of each second die 32, and exposes the metal pad area 321*b* of the active surface 321. The technical effect or function of the protective layer 51 is to protect the sensing area 321*a* of each second die 32 from damaging during subsequent steps (especially wire bonding process). In addition, the protective layer 51 can also reserve the space above the sensing area 321*a* of each second die 32. In details, the protective layer 51 will be removed after the subsequent wire bonding and molding steps, and the reserved space left after removing the protective layer 51 will form an opening, by which the sensing area 321*a* of each second die 32 can be exposed to the outside and the external target object can be sensed.

In this case, after the steps of each second die 32 connected to the package structure semi-finished product 29 (as shown in FIG. 2K) on the second carrier 30, the protective layer 51 is formed from its active surface 321. In other words, the step of forming the protective layer 51 is performed in the panel type processing when each second die 32 is connected to the second carrier 30.

In another case, a protective layer 51 is formed on the active surface 321 before each second die 32 is connected to the package structure semi-finished product 29 on the second carrier 30. In other words, each second die 32 is still in the state of the wafer type processing before it is connected to the second carrier 30, and the protective layer 51 is formed on the second die 32 firstly.

In addition, in other cases, if each second die 32 is the die other than optical sensor chip, it does not have the sensing area, so it is not necessary to protect its active surface 321, nor to expose its active surface 321 in the final package structure. The step of forming the protective layer 51 can be omitted in this case.

Figure 5B:
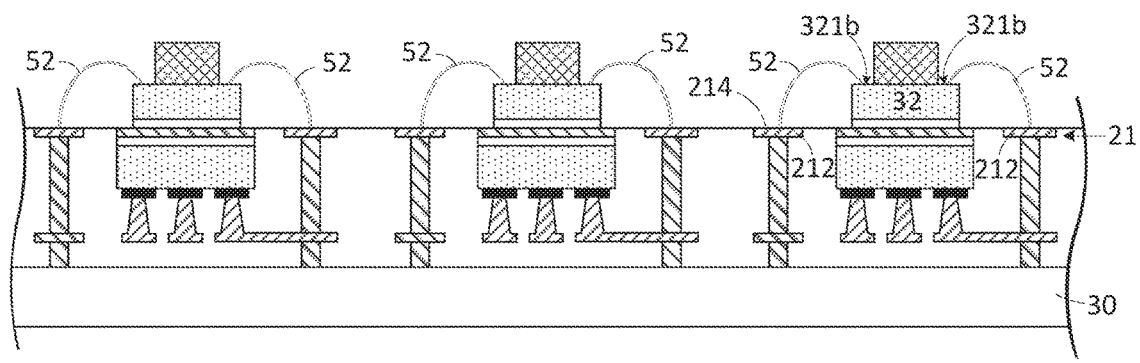

Next, referring to FIG. 5B, where a conductive structure is formed, in this case, which includes the execution of a wire bonding process. Specifically, one end of the wire 52 is bonded to the corresponding metal pad of the metal pad area 321*b* of each second die 32, and the other end of the wire 52 is bonded to the second surface 214 of the circuit part 212 in the first conductive layer 21.

Further, the conductive structure of this case is to connect one end of the wire 52 to the corresponding metal pad of the metal pad area 321*b* of the second die 32 by a wire bonding process, and the other end of the wire 52 to the second surface 214 of the circuit part 212 of the first conductive layer 21. The technical effect or function of the wire 52 is to provide an electrical connection path between the second die 32 and the first conductive layer 21, to fan-out the internal signal of the second die 32 to the first conductive layer 21, or to fan-in the external signal from the first conductive layer 21 to the second die 32. In other words, the wire 52 and the first conductive layer 21 are the fan-out/fan-in circuits for transmitting the signals between the second die 32 and the surrounding layers.

Figure 5C:
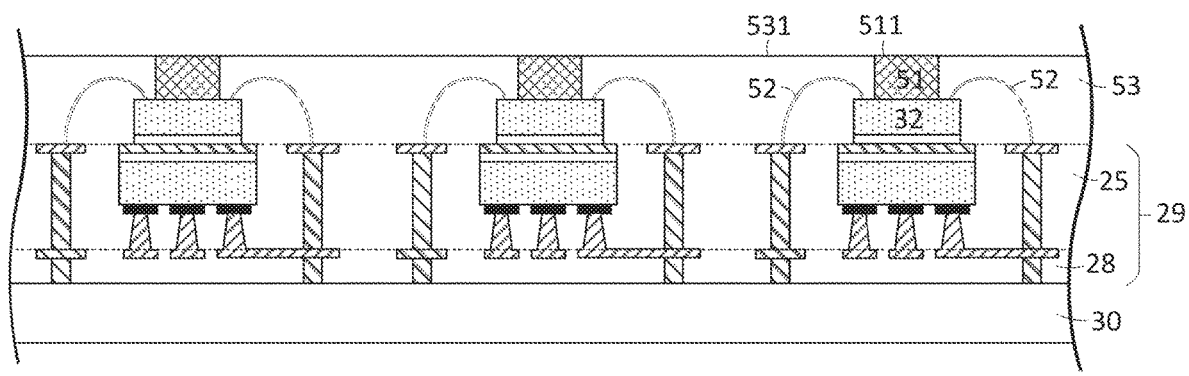

Next, referring to FIG. 5C, to perform the molding process and form a third dielectric layer 53 on the top of package structure semi-finished product 29, between each second die 32 and each protective layer 51; the third dielectric layer 53 is formed and completely covers or wraps each wire 52. The material of the third dielectric layer 53 is the same as that of the first dielectric layer 25 and the second dielectric layer 28, which could be the insulating material, such as Novolac-based resin, epoxy-based resin or silicone-based resin. The material is filled with molds in liquid state and grinded after curing, to expose the first surface 511 of each protective layer 51 from the first surface 531 of the third dielectric layer 53.

Since the material of the third dielectric layer 53 is the same as that of the first dielectric layer 25 and the second dielectric layer 28, the above three dielectric layers may be combined as a single dielectric layer in this case. In other words, it can be regarded as extending the range of the formed first dielectric layer 25 upward, so that it can completely cover each second die 32 and each wire 52, and cover the side wall of each protective layer 51.

Figure 5D:
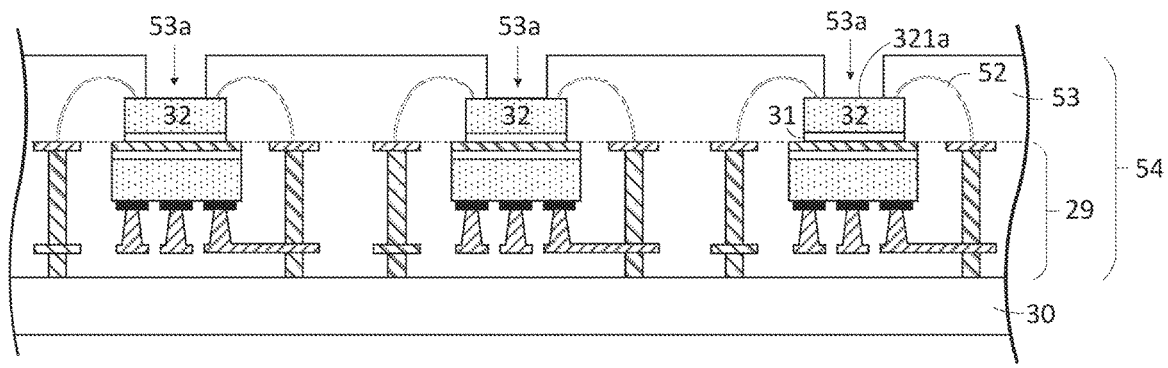

Next, referring to FIG. 5D, remove the protective layer 51 by etching or other cutting methods. The space left after the removal of the protective layer 51 becomes the opening 53*a*, which can expose the sensing area 321*a* of each second die 32 to the outside to sense the external light and perform the sensing on the external target object accordingly.

As mentioned above, the manufacturing method of the first embodiment has been implemented so far that the structural layers formed in the above steps (including the package structure semi-finished product 29, second adhesive layer 31, second die 32, wire 52 and third dielectric layer 53) can be collectively referred to as the package structure 54.

Figure 5E:
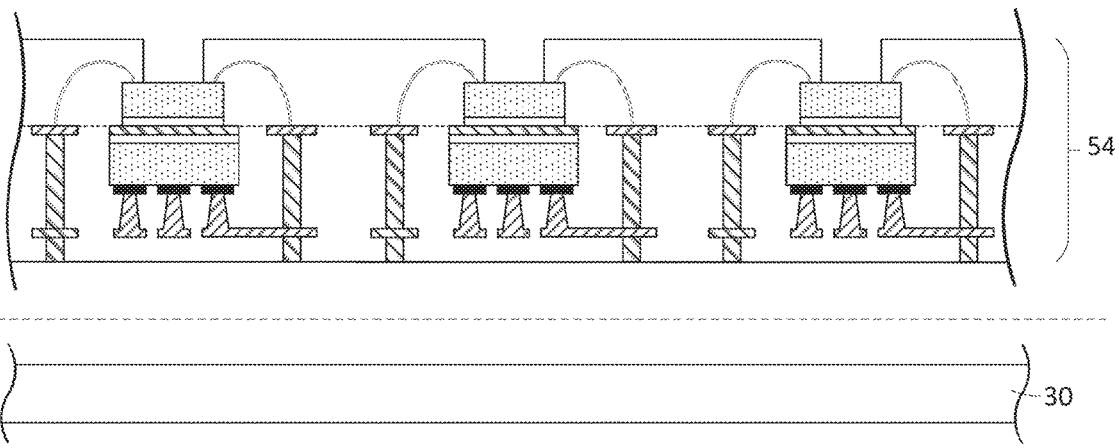

Next, referring to FIG. 5E, remove the second carrier 30 to separate it from the package structure 54. In this step, the package structure 54 can be separated from the second carrier 30 in the same way as separating the first carrier 20, as shown in FIG. 2J.

Figure 5F:
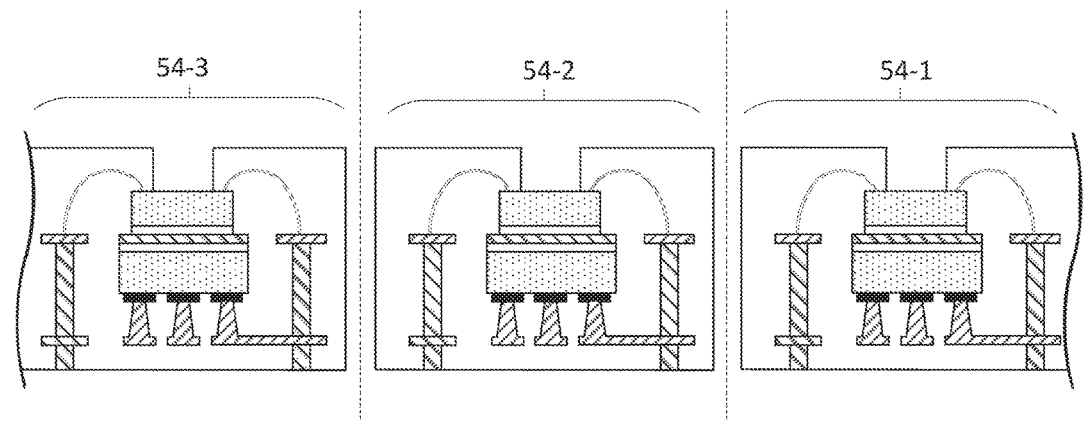

Next, referring to FIG. 5F, the separated package structure 54 is cut into various units. For example, the package structure 54 is cut into the unit 54-1, unit 54-2, and unit 54-3, etc. by performing the laser cutting process (or other cutting methods). For a detailed description of the structural characteristics of each package structure unit in the second embodiment, please refer to the description below and the illustration in FIG. 6A-1 to 6B-2.

Figures 1, 6A:
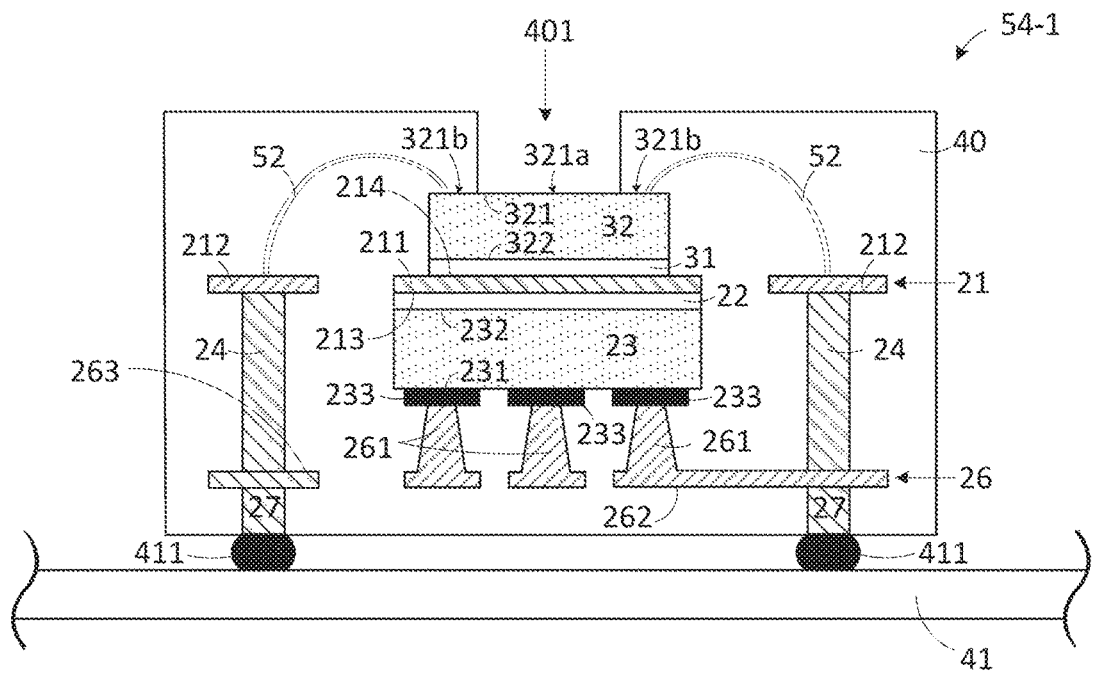
Figures 2, 6A:
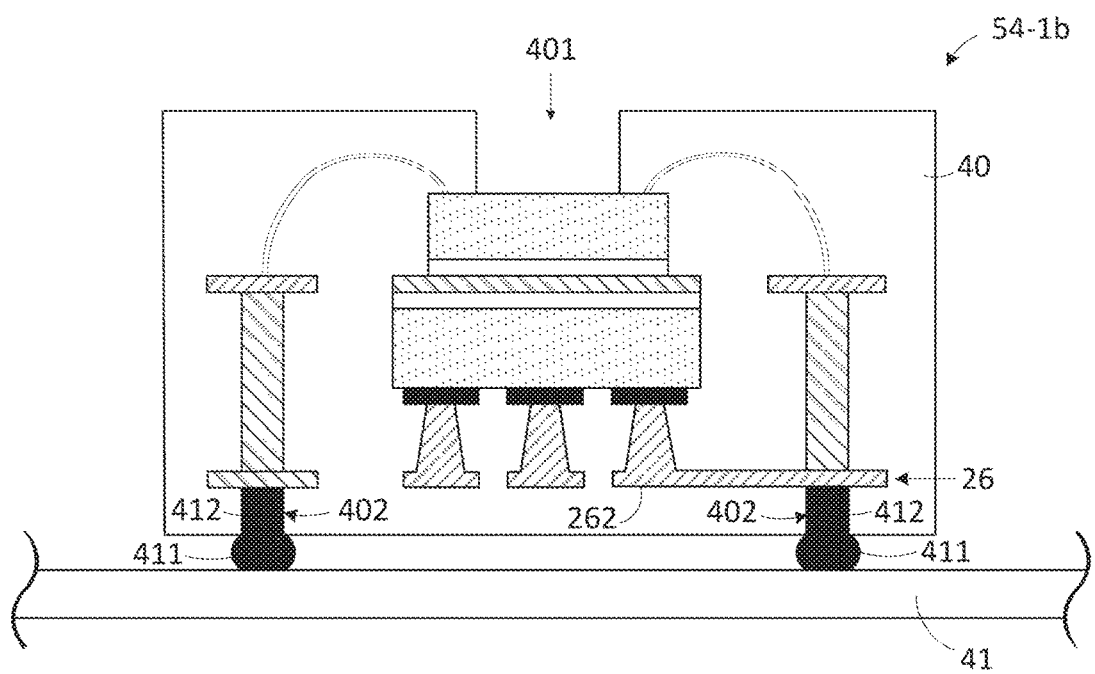

FIGS. 6A-1 to 6B-2 show the section views of the package structure units of different cases according to the second embodiment of the present invention. Referring to FIG. 6A-1, in this case, the package structure of each unit (e.g., unit 54-1) includes: the first conductive layer 21, the second conductive layer 26, the first blind hole pillar 261, the first interlayer pillar 24, the conductive pillar 27, the first die 23, the second die 32, the first adhesive layer 22, the second adhesive layer 31 and the wire 52. Moreover, the above layers and the circuit components are all covered in a dielectric material 40, and only part of the area of the second die 32 (the sensing area 321*a* of its active surface 321) is exposed to the outside.

The above-mentioned structural layers of the package structure unit 54-1, such as the first conductive layer 21, the second conductive layer 26, the first blind hole pillar 261, the first interlayer pillar 24, the first and second adhesive layers 22 and 31, the first die 23, the second die 32 and the wire 52, are all covered in the dielectric material 40. The texture of the dielectric material 40 is the insulating material, such as Novolac-based resin, epoxy-based resin or silicone-based resin; thus, the dielectric material 40 provides the electrical isolation between the structural layers of the package structure unit 54-1. In addition, the dielectric material 40 also provides protection and heat dissipation for the above structural layers. Moreover, the dielectric material 40 has an opening 401 above the sensing area 321*a* of the second die 32, which is exposed to the outside so that the second die 32 can receive the external light from the sensing area 321a and detect the external target object. Furthermore, the conductive pillar 27 in this case is connected to the external conductive bump 411 (or solder ball) of the package structure unit 54-1 respectively, and is electrically connected to an external circuit substrate 41 via the external conductive bump 411. Among them, the external circuit substrate 41 may be a printed circuit board.

The main technical characteristics of the present invention are as follows: based on the setting mode of back-to-back stacking, the first die 23 and the second die 32 are respectively below and above the first conductive layer 21, and each has enough space to set its fan-out/fan-in circuit respectively, so as to meet the elastic design requirements of various circuits. Wherein, the first die 23 is dedicated to the space between the first conductive layer 21 and the second conductive layer 26, to set the fan-out/fan-in redistribution layer circuit composed of the first blind hole pillar 261 and the second conductive layer 26. In addition, the second die 32 is sufficiently dedicated to the top of the first conductive layer 21 to set up a fan-out/fan-in circuit consisting of the wire 52 with the first conductive layer 21.

Based on the above technical characteristics, the fan-out/fan-in circuits of the first die 23 and the second die 32 have their own layout space, thus avoiding the mutual interference. Therefore, it can overcome the constraint of the fan-out/fan-in circuit layout of the controller die 11 and the sensor die 12 respectively in the previous technology. In addition, there is sufficient space above the second die 32 for the sensing area 321a of the second die 32 without interference from the fan-out/fan-in redistribution layer circuit of the first die 23.

FIG. 6A-2 is a section view of the package structure unit 54-1b of another case of the second embodiment of the present invention. Referring to FIG. 6A-2, the package structure unit 54-1b of this case is similar to the package structure unit 54-1 shown in FIG. 6A-1. The difference is that the package structure unit 54-1b of this case does not include the conductive pillar 27. Instead, the technical solution is: to form the opening 402 in the dielectric material 40 of the package structure unit 54-1b, and in the formation position of the original conductive pillar 27. Furthermore, the external conductive bump 411 has an extension part 412, which can be respectively extended into the opening 402, and then connected to the first surface 262 of the second conductive layer 26 to replace the original conductive pillar 27.

In particular, if the package structure unit 54-1b of the embodiment is to be manufactured, the steps of forming the conductive pillar 27 as shown in FIG. 2H are omitted from the corresponding manufacturing method.

Figures 1, 6B:
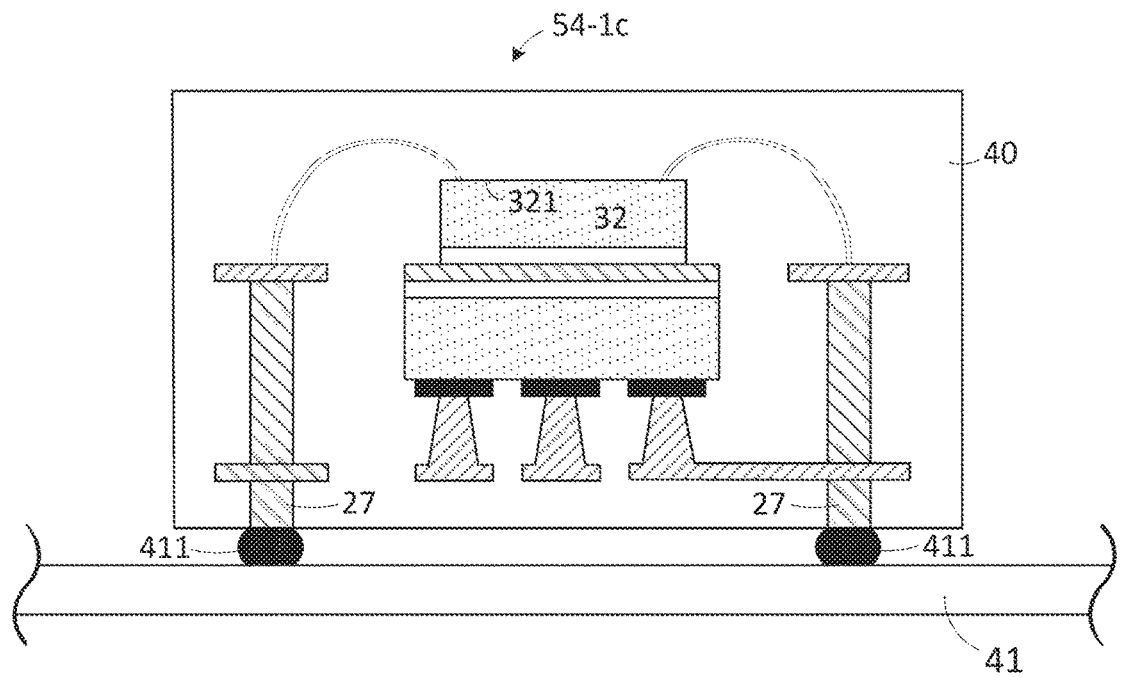
Figures 2, 6B:
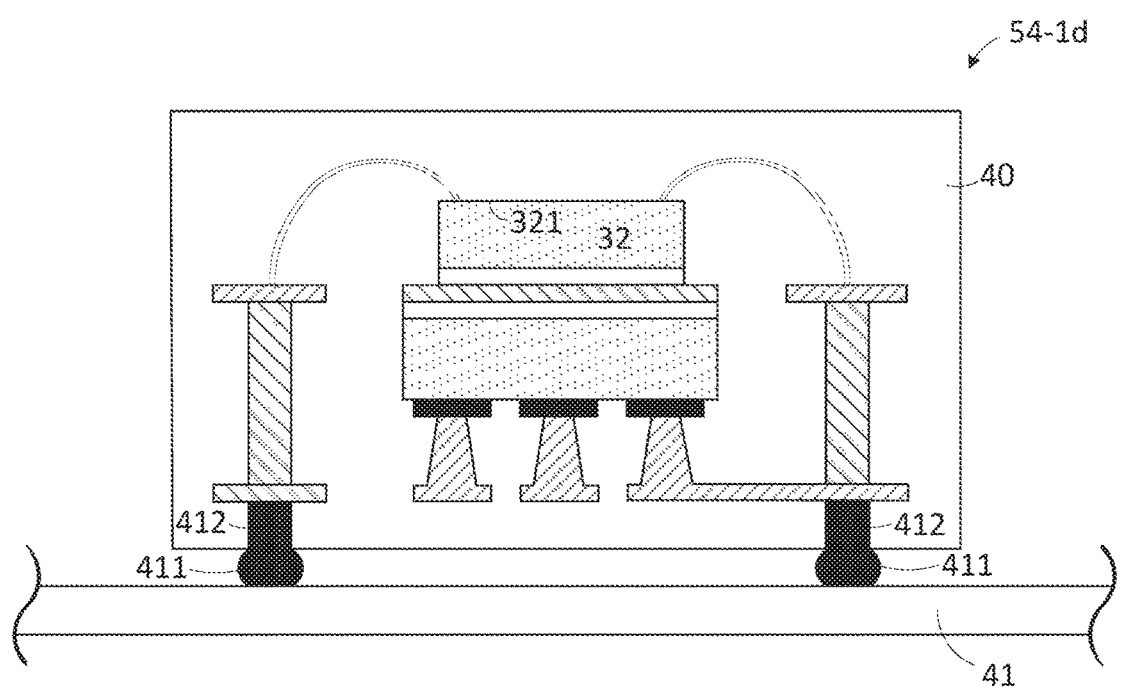

FIG. 6B-1 is a section view of the package structure unit 54-1c of another case in the second embodiment of the present invention. Referring to FIG. 6B-1, the package structure unit 54-1c of this case is similar to the package structure unit 54-1 shown in FIG. 6A-1. The differences are as follows: the second die 32 of this case is other than the optical sensor chip, which has no optical sensing function, so its active surface 321 does not need to be exposed to the outside. Therefore, the dielectric material 40 in this case does not need to form an opening above the second die 32.

In particular, if the package structure unit 54-1c of this case is to be manufactured, the steps of forming the protective layer 51 as shown in FIG. 5A are omitted from the corresponding manufacturing method.

FIG. 6B-2 shows a section view of the package structure unit 54-1d of another case of the second embodiment of the present invention. Referring to FIG. 6B-2. The package structure unit 54-1d of this case is similar to the package structure unit 54-1c shown in FIG. 6B-1. The difference is that the package structure unit 54-1d of this case does not include the conductive pillar 27, but is replaced by an extension part 412 of the external conductive bump 411.

In summary, the present invention can provide sufficient circuit layout space and design elasticity of circuit layout for the first die 23 and the second die 32, and can effectively reduce the overall thickness of the package structure compared with the wire bonding package structure. Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A package structure of a semiconductor device, each unit of the package structure comprising;
   a first conductive layer, which is a single patterned metal layer and has a first surface and a second surface are relatively disposed;
   a second conductive layer, which is a patterned metal layer and located below the first surface of the first conductive layer, and has a first surface and a second surface are relatively disposed;
   a first die, which has an active surface and a back surface, the active surface of the first die has a plurality of metal pads, and the first die is directly disposed on the first surface of the first conductive layer with its back surface through a first adhesive layer;
   a second die, which has an active surface and a back surface, the active surface of the second die has a plurality of metal pads, and the second die is directly disposed on the second surface of the first conductive layer with its back surface through a second adhesive layer;
   a plurality of first blind hole pillars, which is disposed between the second conductive layer and the corresponding metal pad of the first die, to transmit first signals of the first die; and
   a conductive structure, which is electrically connected to the first conductive layer and the corresponding metal pad of the second die, to transmit second signals of the second die;
   wherein the first conductive layer, the second conductive layer, the first die, the second die, the first blind hole pillar and the conductive structure are covered in a dielectric material.

2. The package structure of claim 1, wherein the active surface of the second die further has a sensing area, and the dielectric material has an opening corresponding to a part of the sensing area to expose the sensing area.

3. The package structure of claim 1, further comprises a plurality of first interlayer pillars, which are disposed between the first conductive layer and the second conductive layer to transmit third signals between the first conductive layer and the second conductive layer.

4. The package structure of claim 1, further comprises a plurality of conductive pillars, which are disposed on the first surface of the second conductive layer, and connected to a plurality of corresponding external conductive bumps.

5. The package structure of claim 4, wherein the external conductive bumps have an extension portion respectively, and at least one of the extension portions is a selective displacement of the conductive pillar.

6. The package structure of claim 1, wherein the conductive structure comprises a plurality of second interlayer pillar, a third conductive layer and a plurality of second blind hole pillars to form a redistribution layer circuit to transmit second signals of the second die.

7. The package structure of claim 6, wherein the third conductive layer is located above the first conductive layer and the active surface of the second die, and the second interlayer pillar is disposed between the third conductive layer and the first conductive layer, and the second blind hole pillar is disposed between the corresponding metal pads of the third conductive layer and the second die.

8. The package structure of claim 1, wherein the conductive structure of the package structure has a plurality of wires, and one end of each wire is bonded to the second surface of the first conductive layer, and the other end of each wire is bonded to the corresponding metal pad of the second die to transmit second signals of the second die.

9. A manufacturing method for a package structure of a semiconductor device, comprising:
providing a first carrier;
forming a first conductive layer, which has a first surface and a second surface are relatively disposed, on the first carrier, wherein the first conductive layer is a single patterned metal layer;
disposing a plurality of first dies, which has an active surface and a back surface, on the first surface of the first conductive layer, wherein the back surface of each first die is directly attached to the first surface of the first conductive layer through a first adhesive layer;
forming a first dielectric layer to cover the first die and the first conductive layer;
forming a plurality of first blind holes in the first dielectric layer to expose the corresponding metal pads of each active surface of each first die respectively;
forming a second conductive layer with a first surface and a second surface on the first dielectric layer, and the second conductive layer is filled the first blind hole downward to form a plurality of first blind hole pillars;
forming a second dielectric layer to cover the second conductive layer to form a semi-finished product of the package structure;
turning the semi-finished product of the package structure up and down, and connecting a second carrier under the second dielectric layer after turning, and removing the first carrier;
disposing a plurality of second dies each of which has an active surface and a back surface, on the second surface of the first conductive layer, wherein the back surface of each second die is directly attached to the second surface of the first conductive layer through a second adhesive layer;
forming a conductive structure to electrically connect the corresponding metal pad of the first conductive layer and the active surface of the second die;
forming a third dielectric layer to cover the first conductive layer, the second dies and the conductive structure;
removing the second carrier; and
cutting the package structure into a plurality of package units.

10. The manufacturing method of claim 9, wherein the area of the first carrier and the second carrier is the multiple times of a single wafer, and the first dies and the second dies are cut from a plurality of wafers.

11. The manufacturing method of claim 9, wherein the second die is an optical sensor chip having an active surface with a sensing area, and an opening is formed in the third dielectric layer to expose the sensing area.

12. The manufacturing method of claim 9, wherein before the step of forming the first dielectric layer on the first conductive layer and the first dies, further comprising:
forming a plurality of first interlayer pillars on the first surface of the first conductive layer, that is connected to the later formed second conductive layer.

13. The manufacturing method of claim 9, after the step of forming the second conductive layer on the first dielectric layer, further comprising:
forming a plurality of conductive pillars on the first surface of the second conductive layer, and after completing the manufacture of the package structure, the conductive pillars are respectively connected to a plurality of corresponding external conductive bumps.

14. The manufacturing method of claim 9, wherein the step of forming the conductive structure, comprising:
forming a plurality of second interlayer pillars, a third conductive layer and a plurality of second blind hole pillars to consist of a redistribution layer circuit, to electrically connect the metal pads of each second die to the first conductive layer.

15. The manufacturing method of claim 14, wherein the step of forming the second interlayer pillars, the third conductive layer and the second blind hole pillars, comprising:
forming the second interlayer pillars on the second surface of first conductive layer;
forming a third dielectric layer to cover the first conductive layer, the second dies and the second interlayer pillars;
forming a plurality of second blind holes in the third dielectric layer to expose the corresponding metal pads of the second dies; and
forming a third conductive layer on the third dielectric layer, and the third conductive layer fills the second blind hole downward to form the second blind hole pillars, wherein the third conductive layer connects with the second interlayer pillar.

16. The manufacturing method of claim 9, wherein the step of forming a conductive structure comprising:
performing a wire bonding process to engage one end of a plurality of wires to the second surface of the first conductive layer, and to engage the other end to a corresponding metal pad of the active surface of each second dies.

\* \* \* \* \*